(12) United States Patent
Hosomura

(10) Patent No.: US 11,114,162 B2
(45) Date of Patent: Sep. 7, 2021

(54) NON-VOLATILE SEMICONDUCTOR MEMORY DEVICE INCLUDING A FIRST MEMORY BUNCH AND A SECOND MEMORY BUNCH

(71) Applicant: Kioxia Corporation, Minato-ku (JP)

(72) Inventor: Yoshikazu Hosomura, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/810,910

(22) Filed: Mar. 6, 2020

(65) Prior Publication Data
US 2021/0057028 A1 Feb. 25, 2021

(30) Foreign Application Priority Data

Aug. 22, 2019 (JP) .............................. JP2019-152403

(51) Int. Cl.
| | | |
|---|---|---|
| *G11C 16/04* | (2006.01) |
| *G11C 16/08* | (2006.01) |
| *H01L 27/11565* | (2017.01) |
| *H01L 27/11582* | (2017.01) |
| *G11C 16/24* | (2006.01) |

(Continued)

(52) U.S. Cl.
CPC ............ *G11C 16/0483* (2013.01); *G11C 7/18* (2013.01); *G11C 8/12* (2013.01); *G11C 8/14* (2013.01); *G11C 16/08* (2013.01); *G11C 16/24* (2013.01); *H01L 27/1157* (2013.01);
(Continued)

(58) Field of Classification Search
CPC ..... G11C 16/0483; G11C 16/24; G11C 16/08; H01L 27/11582; H01L 27/11565
See application file for complete search history.

(56) References Cited

U.S. PATENT DOCUMENTS 9,524,773 B2 12/2016 Lee
9,698,272 B1 7/2017 Ikeda et al.
(Continued)

FOREIGN PATENT DOCUMENTS

JP 2008-198314 A 8/2008
JP 2016-062901 A 4/2016
(Continued)

OTHER PUBLICATIONS

Tanaka et al., "Bit Cost Scalable Technology with Punch and Plug Process for Ultra High Density Flash Memory", Symposium on VLSI Technology Digest of Technical Papers, 2007, pp. 14-15.

*Primary Examiner* — Mushfique Siddique
(74) *Attorney, Agent, or Firm* — Oblon, McClelland, Maier & Neustadt, L.L.P.

(57) ABSTRACT

According to the present embodiment, a semiconductor memory device includes a first memory bunch including a first source line, a first source side selecting gate transistor, a first source side selecting gate line, a plurality of first non-volatile memory cells, a plurality of first word lines, a first drain side selecting gate transistor, a first drain side selecting gate line, and a first bit line; a second memory bunch including, a second source line, a second source side selecting gate transistor, a second source side selecting gate line, a plurality of second non-volatile memory cells, a plurality of second word lines, a second drain side selecting gate transistor, a second drain side selecting gate line, and a second bit line; a common bit line; a first bit line transfer transistor; and a second bit line transfer transistor.

18 Claims, 31 Drawing Sheets

(51) Int. Cl.
*G11C 8/12* (2006.01)
*H01L 27/11556* (2017.01)
*H01L 27/1157* (2017.01)
*G11C 7/18* (2006.01)
*G11C 8/14* (2006.01)
*H01L 27/11524* (2017.01)

(52) U.S. Cl.
CPC .. *H01L 27/11556* (2013.01); *H01L 27/11565* (2013.01); *H01L 27/11582* (2013.01); *H01L 27/11524* (2013.01)

(56) References Cited

U.S. PATENT DOCUMENTS

| | | | |
|---|---|---|---|
| 10,090,312 | B2 | 10/2018 | Nakajima et al. |
| 2008/0198667 | A1 | 8/2008 | Hosomura et al. |
| 2012/0307562 | A1* | 12/2012 | Maejima ................ G11C 16/10 365/185.18 |
| 2014/0003149 | A1* | 1/2014 | Maejima ........... H01L 27/11582 365/185.17 |
| 2016/0079164 | A1 | 3/2016 | Fukuzumi et al. |
| 2016/0254059 | A1* | 9/2016 | Ochi ........................ G11C 8/14 365/185.22 |
| 2017/0025412 | A1 | 1/2017 | Jun et al. |
| 2017/0263638 | A1 | 9/2017 | Okada |
| 2018/0069016 | A1* | 3/2018 | Barbato .............. H01L 27/1157 |
| 2018/0240812 | A1 | 8/2018 | Barbato |
| 2018/0261575 | A1 | 9/2018 | Tagami et al. |
| 2018/0350832 | A1 | 12/2018 | Barbato |
| 2019/0088586 | A1 | 3/2019 | Ichinose et al. |
| 2019/0088663 | A1 | 3/2019 | Shikata et al. |
| 2019/0088676 | A1 | 3/2019 | Tagami et al. |
| 2019/0279721 | A1* | 9/2019 | Isobe ................ G11C 16/0483 |

FOREIGN PATENT DOCUMENTS

| | | |
|---|---|---|
| JP | 2017-163114 A | 9/2017 |
| JP | 2017-168623 A | 9/2017 |
| JP | 2017-526157 A | 9/2017 |
| JP | 2018-148071 A | 9/2018 |
| JP | 2019-054162 A | 4/2019 |
| JP | 2019-057335 A | 4/2019 |
| JP | 2019-057532 A | 4/2019 |

* cited by examiner

NON-VOLATILE SEMICONDUCTOR MEMORY DEVICE INCLUDING A FIRST MEMORY BUNCH AND A SECOND MEMORY BUNCH

CROSS-REFERENCE TO RELATED APPLICATION(S)

This application is based upon and claims the benefit of priority from the prior Japanese Patent Application No. 2019-152403, filed on Aug. 22, 2019, the entire contents of which are incorporated herein by reference.

FIELD

An embodiment of the present disclosure relates to a non-volatile semiconductor memory device.

BACKGROUND

A NAND flash memory is known as a non-volatile semiconductor memory device. In order to increase the capacity of the NAND flash memory, a three-dimensional NAND flash memory having a configuration that a large number of memory cells stacked has been put into practical use. BiCS (Bit Cost Scalable) is known as a technique for increasing the capacity by a three-dimensional structure and reducing a bit-cost.

DETAILED DESCRIPTION

Figure 1:
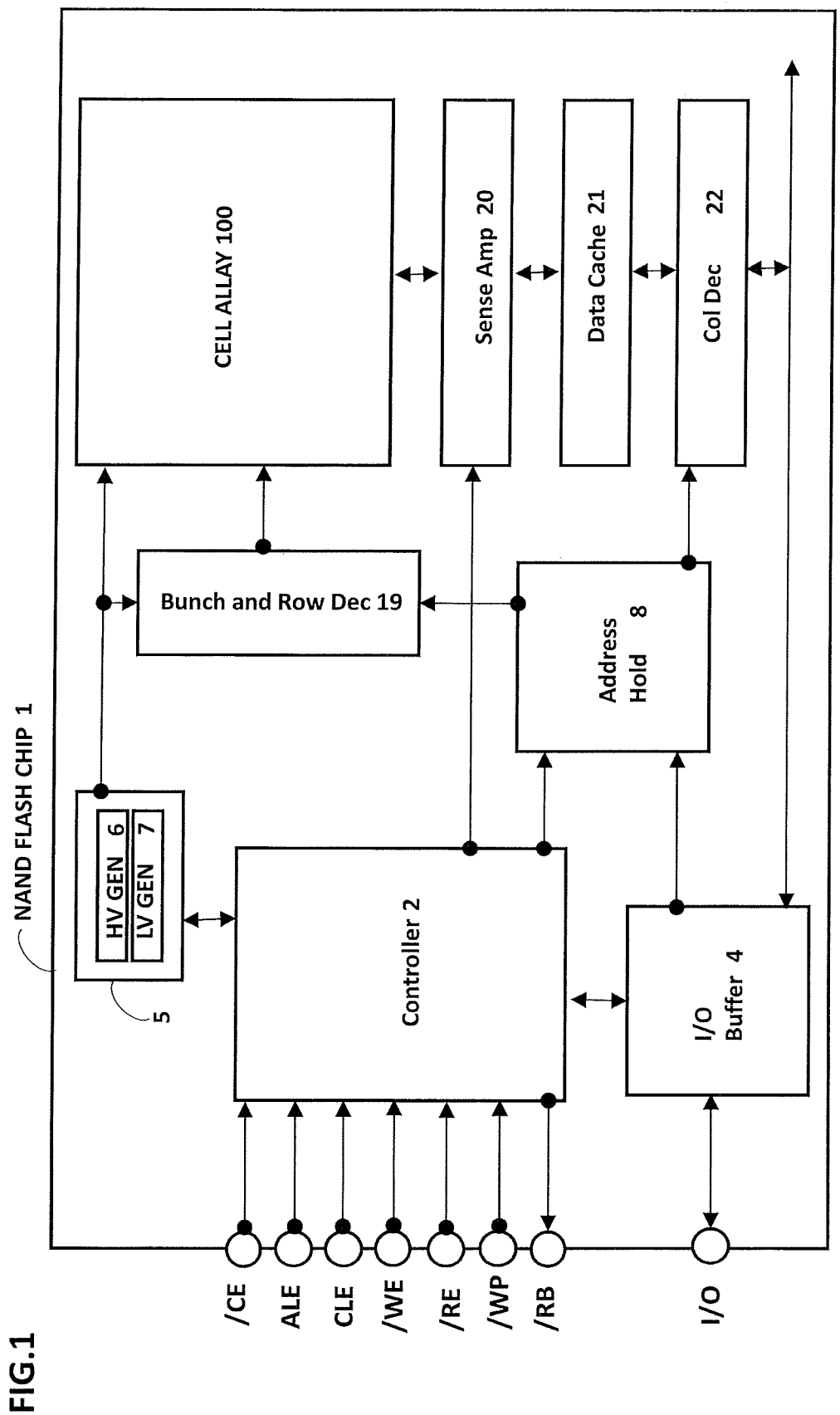
FIG. 1 is a block diagram showing a configuration of a semiconductor memory device according to the present embodiment.

A semiconductor memory device according to the present embodiment includes a first memory bunch, a second memory bunch, a common bit line, a first bit line transfer transistor and a second bit line transfer transistor. The first memory bunch includes a first source line extending in a first direction and a second direction perpendicular to the first direction, a first source side selecting gate transistor arranged on one side in a third direction intersecting the first direction and the second direction of the first source line, a first source side selecting gate line connected to a gate of the first source side selecting gate transistor, the first source side selecting gate line extending in the first direction and the second direction, a plurality of first non-volatile memory cells series connected to the first source side selecting gate transistor, the plurality of first non-volatile memory cells arranged on the one side in the third direction of the first source side selecting gate transistor, a plurality of first word lines each connected to a gate of a corresponding one of the plurality of first non-volatile memory cells, the plurality of first word lines extending in the first direction and the second direction, a first drain side selecting gate transistor connected to one of the plurality of first non-volatile memory cells, the first drain side selecting gate transistor arranged on the one side in the third direction of the plurality of first non-volatile memory cells, a first drain side selecting gate line connected to a gate of the first drain side selecting gate transistor, the first drain side selecting gate line extending in the first direction and the second direction, and a first bit line connected to the first drain side selecting gate transistor, the first bit line arranged on the one side in the third direction of the first drain side selecting gate line, a longitudinal direction of the first bit line being in the second direction. The second memory bunch includes a second source line extending in the first direction and the second direction, the second source line arranged on the one side in the third direction of the first bit line, a second source side selecting gate transistor arranged on the one side in the third direction of the second source line, a second source side selecting gate line connected to a gate of the second source side selecting gate transistor, the second source side selecting gate line extending in the first direction and the second direction, a plurality of second non-volatile memory cells series connected to the second source side selecting gate transistor, the plurality of second non-volatile memory cells arranged on the one side in the third direction of the second source side selecting gate transistor, a plurality of second word lines each connected to a gate of a corresponding one of the plurality of second non-volatile memory cells, the plurality of second word lines extending in the first direction and the second direction, a second drain side selecting gate transistor connected to one of the plurality of second non-volatile memory cells, the second drain side selecting gate transistor arranged on the one side in the third direction of the plurality of second non-volatile memory cells, a second drain side selecting gate line connected to a gate of the second drain side selecting gate transistor, the second drain side selecting gate line extending in the first direction and the second direction, and a second bit line connected to the second drain side selecting gate transistor, the second bit line arranged on the one side in the third direction of the second drain side selecting gate line, a longitudinal direction of the second bit line being in the second direction. The first bit line transfer transistor connects between the common bit line and the first bit line. The second bit line transfer transistor connects between the common bit line and the second bit line.

The non-volatile semiconductor memory device according to the present embodiment will be described in detail with reference to drawings. In the following description, components having substantially the same functions and configurations are denoted by the same reference numerals, and redundant description will be made only when necessary. The following embodiments illustrate devices and methods for embodied the technical ideas of the embodiments, and the technical ideas of the embodiments do not specify the materials, shapes, structure, arrangement, or the like of the components as follows. The technical idea of an embodiment may be modified in a variety of ways to the extent of the patent.

Drawings may be represented by widths, thickness, shapes, etc. of parts compared to actual embodiments for clarity of description, but they are by way of example only and not limitation of the interpretation of the present invention. In the present specification and in each figure, elements having the same functions as described with respect to the existing figure may be denoted by the same reference numerals, and redundant description may be omitted.

Multiple films formed by the same process have the same layer structure and are composed of the same material. For the purposes of this specification, multiple films formed by the same process are treated as layers, each of which resides on the same layer, even if the layers serve different functions or roles.

The Semiconductor Memory Device According to the First Embodiment

First, the overall configuration of the semiconductor memory device according to the first embodiment will be described with reference to FIG. 1. FIG. 1 is an example of a block diagram showing a basic structure of a semiconductor memory device. In FIG. 1, a part of the connection of each block is indicated by an arrow line, but the connection between the blocks is not limited to this.

As shown in FIG. 1, the semiconductor memory device (NAND FLASH CHIP) 1 includes a controller (Controller) 2, an input-output circuit (I/O Buffer) 4, a voltage generating circuit 5, an address register (Address Hold) 8, a bunch decoder and a row decoder (Bunch and Row Dec) 19, a sense amplifier (Sense Amp) 20, a data cache (Data Cache) 21, and a column decoder (Col Dec) 22 in addition to the memory cell array (Cell Allay) 100.

The input-output circuit 4 is connected to the input-output signal terminal I/O, the controller 2, the address register 8, and the column decoder 22. The input-output circuit 4 receives data from the outside of the semiconductor memory device 1 through the input-output signal terminal I/O, and transmits the data to the outside of the semiconductor memory device 1 through the input-output signal terminal I/O.

Communication between the outside of the semiconductor memory device 1 and the semiconductor memory device 1 complies with, for example, the NAND interface standard. There are, for example, eight I/O signal terminals. The input-output circuit 4 receives address data ADD, command data CMD, and write data supplied to the input-output signal terminal I/O for a plurality of cycles. The input-output circuit 4 supplies command data CMD and write data, which are part of the data supplied from the input-output signal terminal I/O, to the controller 2.

The input-output circuit 4 supplies the address data ADD, which is part of the data supplied from the input-output signal terminal I/O, to the address register 8. The input-output circuit 4 transmits the read data supplied from the column decoder via the data bus line to the input-output signal terminal I/O for a plurality of cycles.

The controller 2 is connected to the chip enable signal terminal /CE, address latch enable signal terminal ALE, command latch enable signal terminal CLE, write enable signal terminal /WE, read enable signal terminal /RE, write protect signal terminal /WP, and ready-busy signal terminal /RB. The controller 2 is further connected to a voltage generating circuit 5, a sense amplifier 20, and an address register 8.

The controller 2 acquires the data of the input-output signal terminal I/O by the combination of various signals received at the chip enable signal terminal /CE, the address latch enable signal terminal ALE, the command latch enable signal terminal CLE, the write enable signal terminal /WE, the read enable signal terminal /RE, and the write protect signal terminal /WP, and controls the operation of the entire semiconductor memory device 1 in accordance with the command CMD included in the data.

The signal supplied to the chip enable signal terminal /CE enables semiconductor memory device 1. The signal supplied to the address latch enable signal terminal ALE notifies the semiconductor memory device 1 that the received input-output signal I/O is an address. The signal supplied to the command latch enable signal terminal CLE notifies the semiconductor memory device 1 that the data received on the input-output signal terminal I/O is a command. The signal supplied to the write enable signal terminal /WE commands the semiconductor memory device 1 to input the data supplied to the input-output signal terminal I/O. The signal supplied to the read enable signal terminal /RE commands the semiconductor memory device 1 to output the read data from the input-output signal terminal I/O. The signal supplied to the write protect signal terminal /WP instructs the semiconductor memory device 1 to disable the data writing and erasing.

The controller 2 supplies a signal to the ready-busy signal terminal /RB to notify the state of the semiconductor memory device 1 to the outside. A signal is supplied to the ready-busy signal terminal /RB to indicate whether the semiconductor memory device 1 is in a ready state (a state in which an external instruction is acceptable) or a busy state (a state in which an external instruction is not acceptable).

The controller 2 transfers the data DAT received from the input-output circuit 4 to the sense amplifier 20 and the data cache 21.

The address register 8 temporarily holds the received address ADD. The address register 8 then transfers a row address RADD to the bunch decoder and a row decoder 19 and transfers a column address CADD to the column decoder 22.

The controller 2 controls, for example, the voltage generating circuit 5, the bunch decoder and the row decoder 19, the sense amplifier 20, the data cache 21, the address register 8, and the column decoder 22 in accordance with the command CMD received from the input-output circuit 4, and performs write operations, read operations, erase operations, and the like.

The voltage generating circuit 5 includes a high voltage generating circuit (HV GEN) 6 and a low voltage generating circuit (LV GEN) 7. The high voltage generating circuit 6 generates the high voltage required for write, read, and erase operations in accordance with the control of the controller 2, and supplies the generated high voltage to, for example, the memory cell array 100, the bunch decoder and the row decoder 19, and the sense amplifier 20. The bunch decoder and the row decoder 19 and sense amplifier 20 apply the voltage supplied by the low-voltage generating circuit 7 to the memory cell transistor in the memory cell array 100.

The Bunch decoder and the row decoder 19 are connected to the address register 8 and the memory cell array 100. The bunch and the row decoders 19 decode the row address RADD and apply the required voltages to the memory cell array 100 based on the decoding results.

The sense amplifier 20 is connected to the controller 2, the memory cell array 100, and the data cache 21. During the read operation, the data read from the memory cell array 100 is sensed by the sense amplifier 20. The sense amplifier 20 transmits the read data to the data cache 21. The sense amplifier 20 transmits the write data to the memory cell array 100 during the write operation.

The data cache 21 is connected to the sense amplifier 20 and the column decoder 22. The data cache 21 includes a plurality of latch circuits. The latch circuit temporarily holds the write data supplied from the input-output circuit 4 through the data bus and the column decoder 22, and temporarily holds the read data sensed by the sense amplifier 20.

The column decoder 22 is connected to the address register 8, the data cache 21 and the input-output circuit 4. For example, during write and read operations, the column address CADD is decoded and a latching circuit in the data cache 21 is selected according to the decoding result by the column decoder 22.

The Circuit Configuration of the Memory Cell Array

Figure 2:
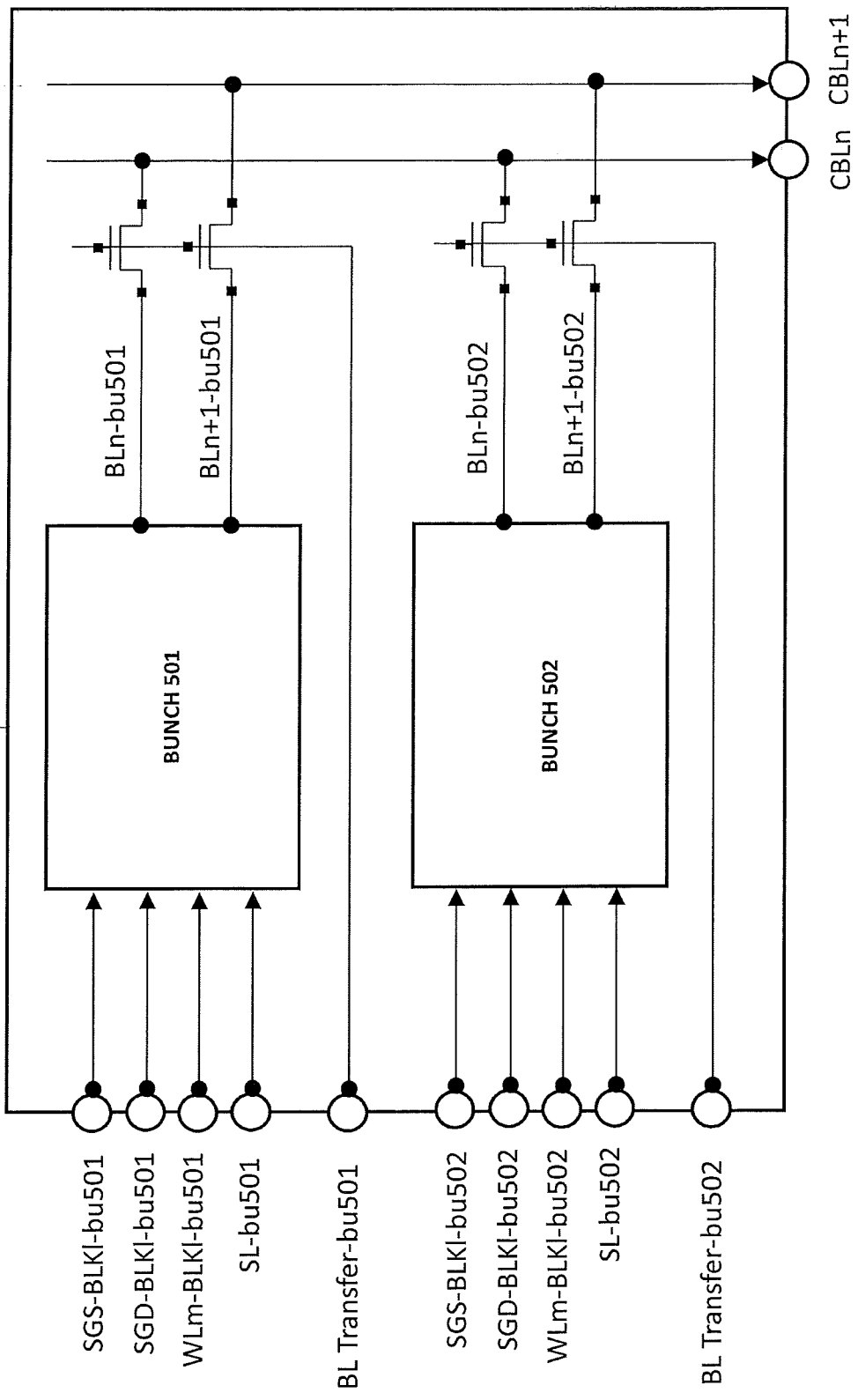
FIG. 2 is a circuit block diagram showing a configuration of a memory cell array according to the present embodiment.
Figure 3:
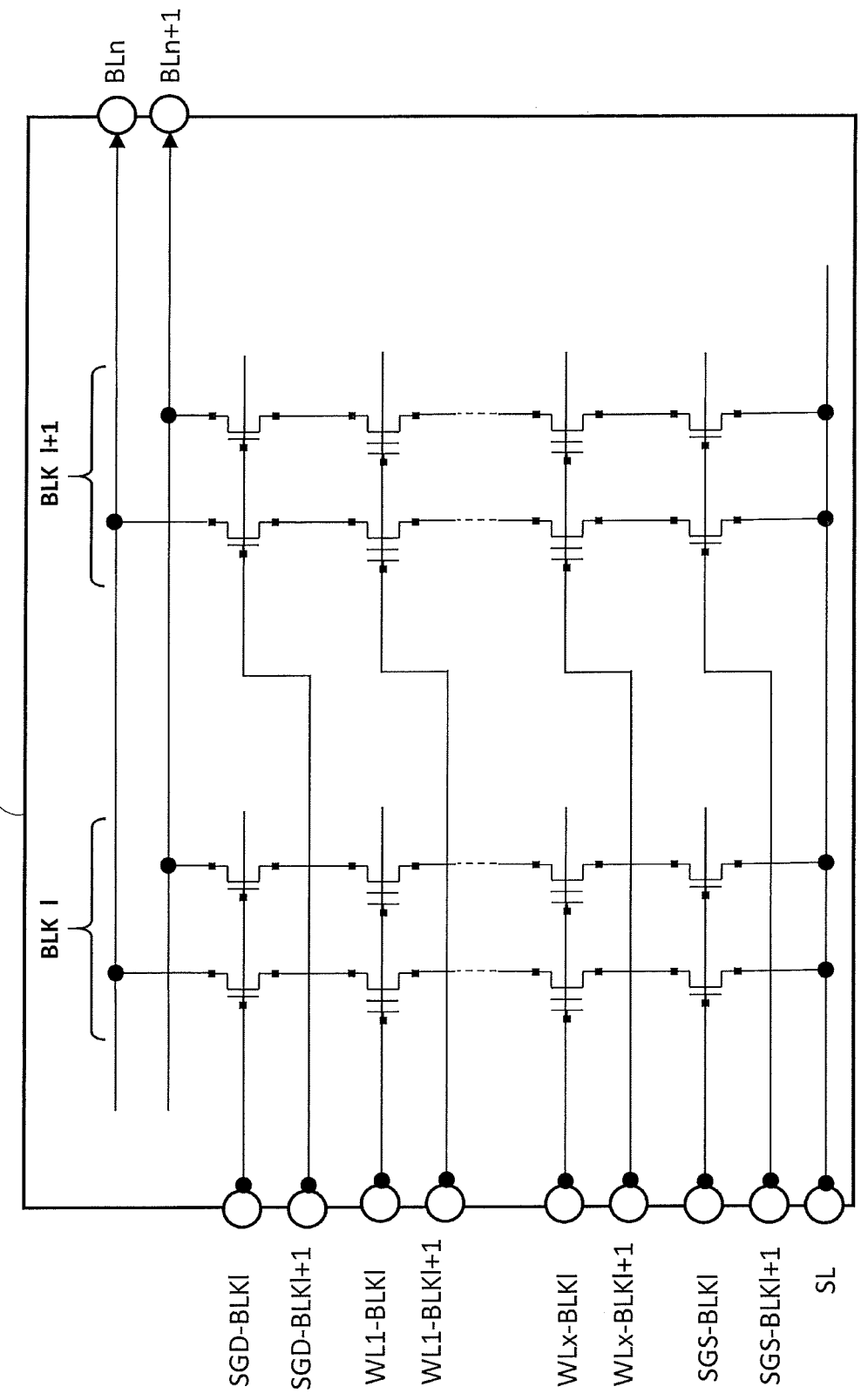
FIG. 3 is a circuit block diagram showing a configuration of a memory bunch according to the present embodiment.

Next, the circuit configuration of the memory cell array 100 will be described with reference to FIGS. 2 and 3. FIG. 2 is a circuit block diagram showing a configuration of a memory cell array included in the semiconductor memory device according to the present embodiment. FIG. 3 is a circuit block diagram showing a configuration of a memory bunch included in a semiconductor memory device according to the present embodiment. The memory cell array 100 includes a plurality of bunches (BUNCH501, BUNCH502 . . . ).

Each of the BUNCH contains a plurality of blocks (BLKI, BLKI+1 . . . I is an integral number of 1 or more). Each of the block BLKs contains a plurality of NAND strings. Within the NAND strings, a plurality of non-volatile memory cell transistors (hereafter also referred to as "memory cells") is connected in series. The number of the BUNCH, the block BLK, the NAND string, and the memory cell in the memory cell array 100 are arbitrary.

The block BLKI is connected to a plurality of Bit lines BL (BLn, BLn+1 . . . n is an integral number of 1 or more). The block BLKI is connected to the Source line SL common to the block BLKI. The NAND string corresponding to each of the Bit lines BL is connected between the Bit line BL and the Source line SL.

Each of the NAND strings include a drain side selection gate transistor connected to the drain side selection gate line SGD-BLKI, a number of memory cells connected to the word line WLm-BLKI (m is an integral number of 1 or more), and a source side selection gate transistor connected to the source side selection gate line SGS-BLKI in series.

The memory cells of the NAND strings included in the block BLKI are connected to a common drain side selection gate line SGD-BLKI, a word line WLm-BLKI (m is an integral number of 1 or more), and a source-side selection gate line SGS-BLKI. Note that the number of drain side selection gate transistor, memory cell, and source side selection gate transistor in the NAND string are arbitrary, and the number of corresponding drain side selection gate line SGD-BLKI, word line WL-BLKI, and source side selection gate line SGS-BLKI are arbitrary. For example, in the respective block BLKI, a plurality (e.g., 4) drain-side selection gate line SGD-BLKI and a plurality (e.g., 4) source-side selection gate line SGS-BLKI may be configured so that they can be controlled independently electronically. In such cases, the number of source side selection gate lines SGS-BLKI that can be controlled independently electronically may be the same as or less than (e.g., 1) the number of drain side selection gate lines SGD-BLKI that can be controlled independently electronically. The block BLKI is explained here as an example, but the other block BLKI+1, etc. are similar circuits.

In the BUNCH501, each of the NAND strings are connected to corresponding Bit lines BL (BLn-bu501, BLn+1-bu501 . . . n is an integral number of 1 or more) shared between the blocks BLK. In the BUNCH501, all the NAND strings are connected to the Source line SL-bu501 common to the BUNCH501. Here, the BUNCH501 is explained as an example, but the other BUNCH502, etc. are similar circuits.

In the memory cell array 100, the Bit lines BL (BLn-bu501, BLn-bu502 . . . ) arranged in the same row (overlapping position in the Z-direction) in each BUNCH is connected to a corresponding common Bit line CBL (CBLn) shared among the BUNCH. A Bit line transfer transistor (BL Transfer Tr.) is connected between the Bit line BL (BLn-bu501, BLn-bu502) and the common Bit line CBL (CBLn).

All Bit line transfer transistor (BL Transfer Tr.) connected to Bit line BL (BLn-bu501, BLn+1-bu501 . . . n is an integral number of 1 or more) in the BUNCH501 are connected to a common Bit line transfer line (BL Transfer-bu501). Here, a BUNCH501 and Bit line BL (BLn-bu501, BLn-bu502 . . . ) are explained as an example, but other BUNCH502 and Bit line BL (BLn+1-bu501, BLn+1-bu502 . . . ) are similar circuits.

The Structure of the Memory Cell Array

Figure 4:
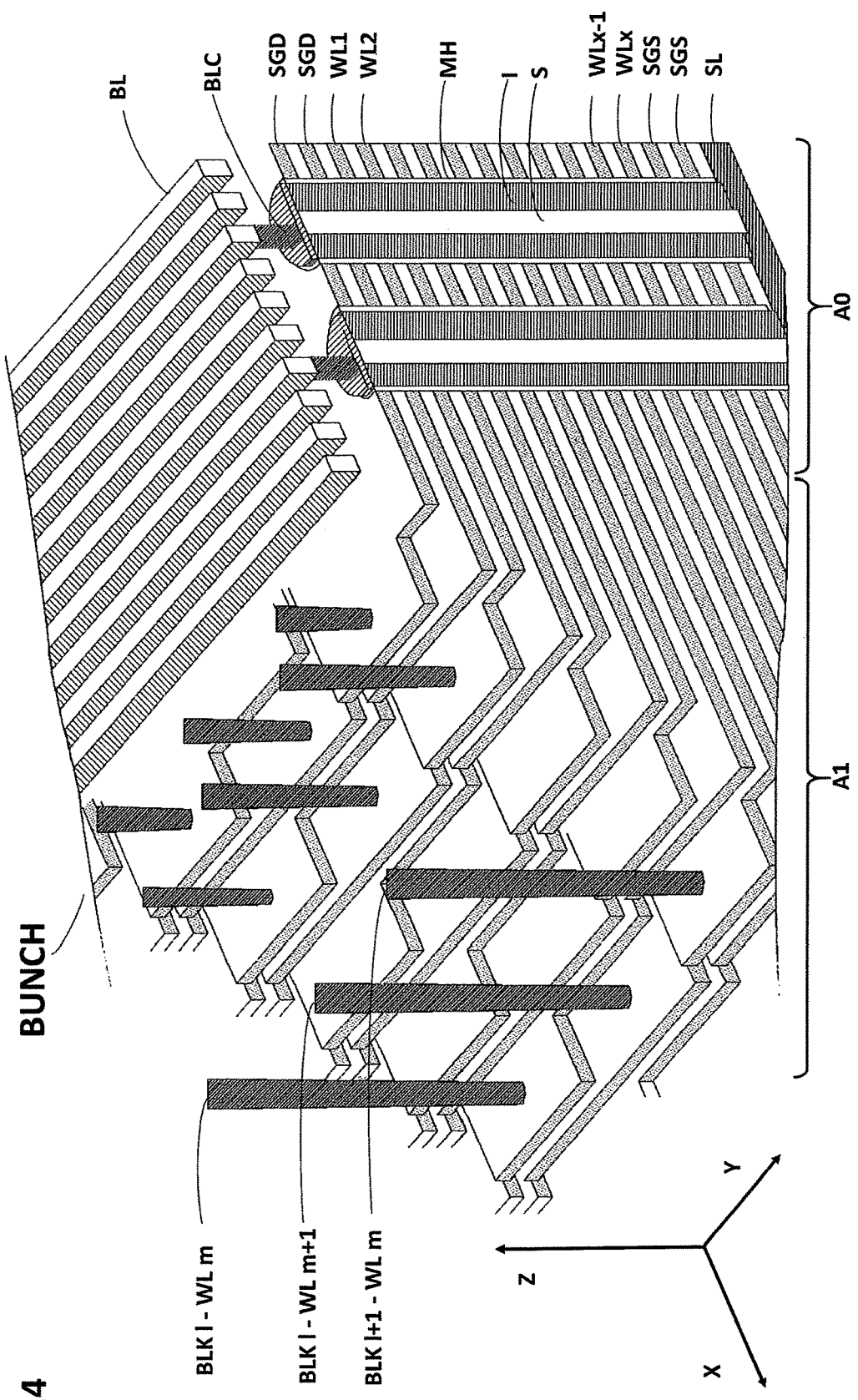
FIG. 4 is a schematic perspective view of a memory bunch according to the present embodiment.

The structure of the memory cell array 100 will be described with reference to FIGS. 4-9. FIG. 4 is a schematic perspective view showing the basic structure of a single BUNCH. The BUNCH corresponds to one layer of a plurality of BUNCH stacked on the same semiconductor substrate SUB. The BUNCH is formed by stacking a Source line SL, two layers of a source-side selection gate lines SGS, word lines WLx and WLx−1, . . . WL2, WL1, and two layers of a drain side selection gate lines SGD in the Z-direction with an insulating film such as a silicon dioxide film interposed therebetween in order from the lower layer.

The drain-side selection gate line SGD, the word line WL1, WL2, . . . WLx, and the source-side selection gate line SGS each form a plate extended in the X-Y direction. The drain-side selection gate line SGD, the word lines WL1, WL2 . . . WLx, and the source-side selection gate line SGS are each connected to the NAND string extending in the Z-direction. The numbers of the drain-side selection gate line SGD and the source-side selection gate line SGS are arbitrary. For example, in the case where a plurality of plate-like conductors are arranged as the drain-side selection gate line SGD or the source-side selection gate line SGS, cutoff characteristics of the drain-side selection gate transistor or the source-side selection gate transistor can be improved.

The NAND string is formed in the memory hole MHs that go through the layers of the drain side selection gate line SGD, the word line WL1, WL2 . . . WLx, and the source side selection gate line SGS included in the BUNCH. An insulating film I is formed on the side wall of the memory hole MH, and the inside of the memory hole MH is filled with semiconductor film S. Although not shown in detail, the insulating film I includes, for example, a tunnel insulating film arranged at the outer periphery of the semiconductor film S, a charge trapping film arranged at the outer periphery of the tunnel insulating film, and a block insulating film arranged at the outer periphery of the charge trapping film. The drain side selection gate line SGD, the word line WL1, WL2, . . . WLx, and the source side selection gate line SGS correspond to the gate terminals of the transistor and the semiconductor film S corresponds to the channels of the transistor. Transistor thresholds vary in the amount of charge trapped to the charge trapping film, and data is stored by the change in the thresholds.

In each BUNCH, a plurality of NAND strings are connected to a common source line SL at the bottom layer in the Z direction. The NAND strings are also connected to a corresponding one of a plurality of Bit line BLs running in the Y direction at the top layer in the Z direction, and further through an insulating film. The connections between the NAND string and the Bit line BL are made by the Bit line contact BLC formed in the opening formed in the insulating film.

As shown in FIG. 4, the BUNCH has a memory cell array region (the right part of FIG. 4) A0 and the drawn region (the left part of FIG. 4) A1 in a plan view (the XY plane). In memory cell array region A0, a number of the NAND strings described above are vertically arranged. In the drawn region A1, the drain-side selection gate line SGD, the word line WL1, WL2, . . . WLx, the source-side selection gate line SGS, and the Source line SL are each formed by extracting terminals in a stepwise manner. Each terminal is connected to a vertical word line WL (BLKI-WLm, BLKI-WLm+1, BLKI+1-WLm . . . ) through a contact hole opened in the insulating film from the top of the BUNCH. These vertical word lines are connected to wiring on the upper layer of the BUNCH of the stacked top layer and are connected to various drive circuits of the row system.

Referring to FIGS. 5-9, an embodiment in which the Bit line BL is drawn from the stacked BUNCH and connected to the vertically common Bit line CBL via a Bit line transfer transistor BL Transfer Tr.

Figure 5:
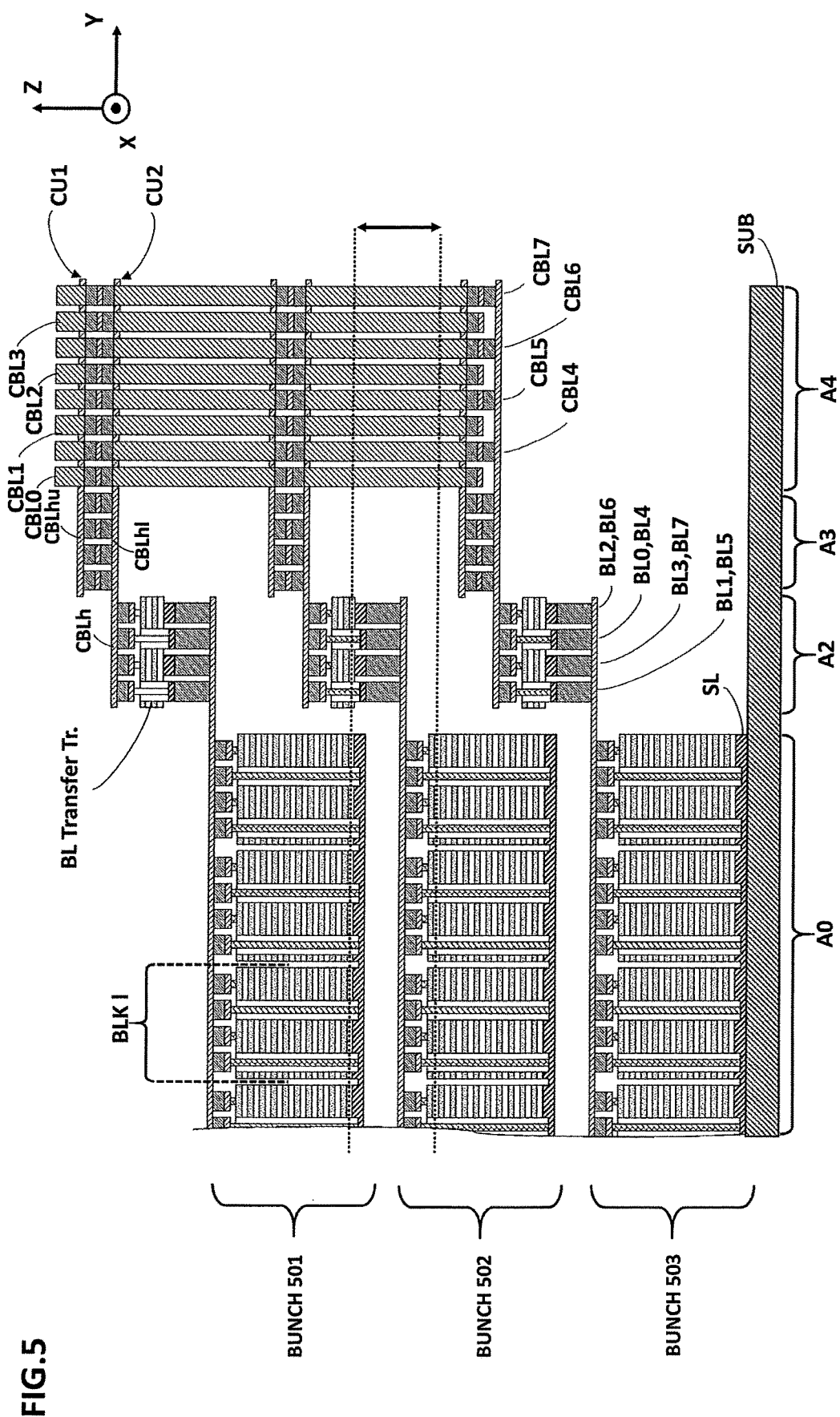
FIG. 5 is a cross-section showing a structure of a memory cell array according to the present embodiment.

FIG. 5 is a cross-section view (YZ plane) of a stacked body including a BUNCH501, 502, and 503 stacked on the semiconductor substrate SUB. In the following drawings, the illustration of the semiconductor substrate SUB may be omitted as appropriate. Adjacent to the memory cell array region A0 including the BUNCH501, 502, and 503, a Bit line transfer transistors BL Transfer Tr. corresponding to each BUNCH are arranged in the Bit line transfer transistor region A2. In addition, the vertical common Bit lines CBL0, CBL1, CBL7 are arranged in parallel in the vertical direction (Z direction), in the vertical common Bit line region A4. A connection region A3 is arranged between the Bit line transfer transistor region A2 and the vertical common Bit line region A4. In the present embodiment, each of the vertical common Bit lines CBL0, CBL1, . . . CBL7 extend linearly along the Z direction from one end (the upper end in the Z direction) to the other end (the lower end in the Z direction). More specifically, the longitudinal direction of each of the vertical common Bit lines CBL0, CBL1, . . . CBL7 are along the Z direction from at least a position corresponding to the drain-side selection gate line SGD of the second bottom bunch BUNCH 502 in the Z direction to a position corresponding to the source-side selection gate line SGS of the third bottom bunch BUNCH 503 in the Z direction. The vertical common Bit lines CBL are connected to the Bit lines BL of the respective bunches BUNCH via the common Bit lines CBLh and the Bit line transfer transistor BL Transfer Tr.

In the present embodiment, the Bit line transfer transistor BL Transfer Tr. is placed on the Bit line BL (position higher than the Bit line BL in Z direction). The Bit line transfer transistor BL Transfer Tr. of the BUNCH503 may be adjacent to the source-side selection gate transistor layer of the BUNCH502, which is the upper stage of the BUNCH503. In this case, the Bit line transfer transistor BL Transfer Tr. of the BUNCH503 may be formed in the same layers by the same processes as the source-side selection gate transistor of the BUNCH502. However, and not limited to this, the Bit line transfer transistor BL Transfer Tr. may be formed on the same layer by the same processes as any layer above the Bit line BL or may be formed independently of the memory cell array.

Figure 6:
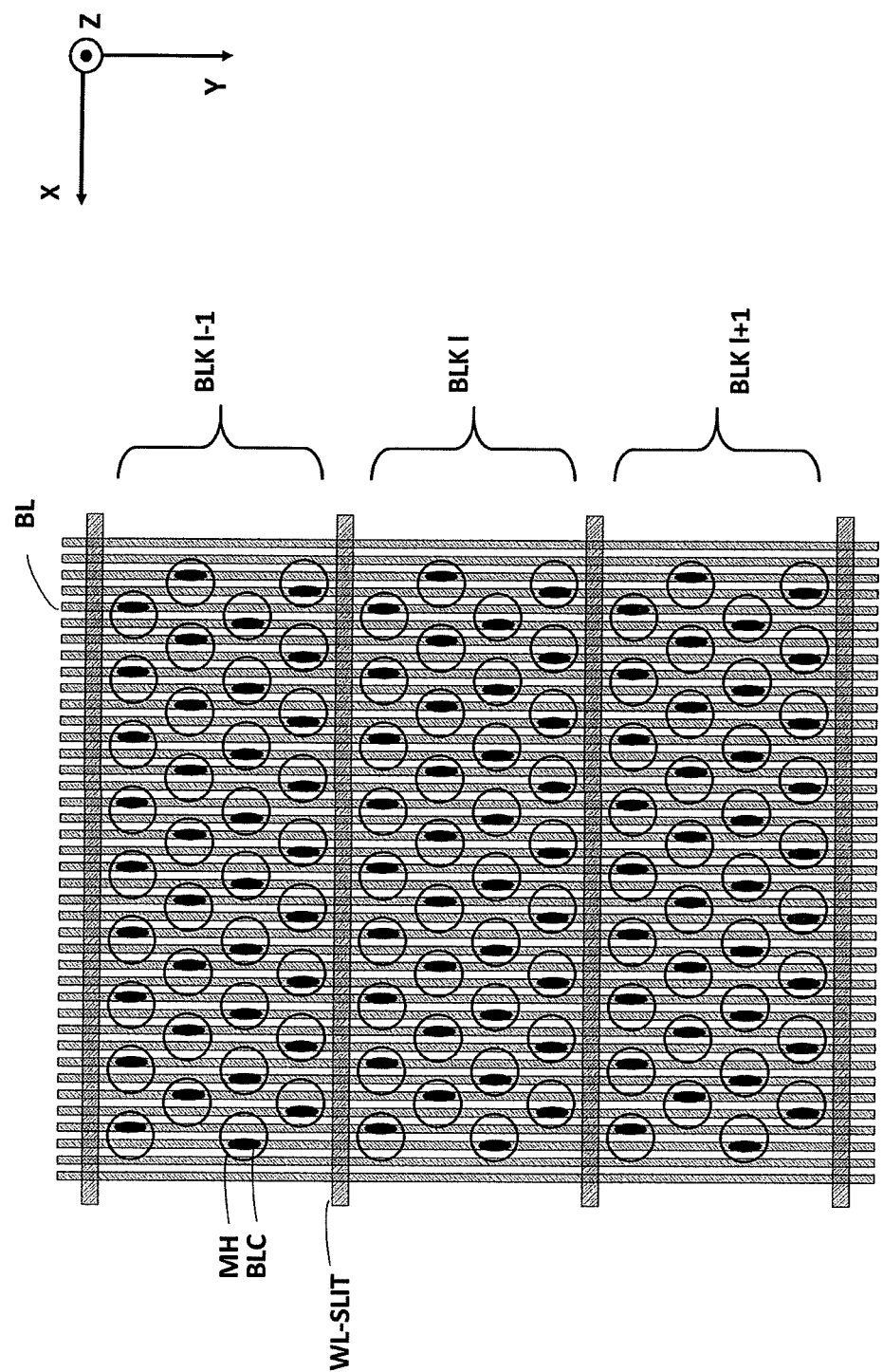
FIG. 6 is a plan view showing the arrangement of the memory hole and the connection structure with the Bit line BL according to the present embodiment.

FIG. 6 is a plan view (XY-plane) showing the arrangement of the memory holes and the connection structure between the memory holes and the Bit lines BL in the BUNCH. The BUNCH is divided into a plurality of blocks BLK ( . . . BLKI−1, BLKI, BLKI+1 . . . ) in the Y-direction, and a word line slip WL-SLIT is formed between the plurality of blocks BLK in order to electronically separate the plate-like layers such as the drain side selection gate line SGD, the word line WL1, WL2 ... WLx, and the source side selection gate line SGS. This word line-slip WL-SLIT is filled with an insulating film.

In each block-BLK, two groups of memory holes MHs (NAND strings) arranged in a staggered pattern with a shift of ½ pitch are arranged in parallel in the X-direction.

Bit lines BL are arranged in parallel in the Y direction, and its pitch are ¼ of the memory holes MH. The part indicated by the black ellipse in the figure is the Bit line contact BLC.

Figure 7:
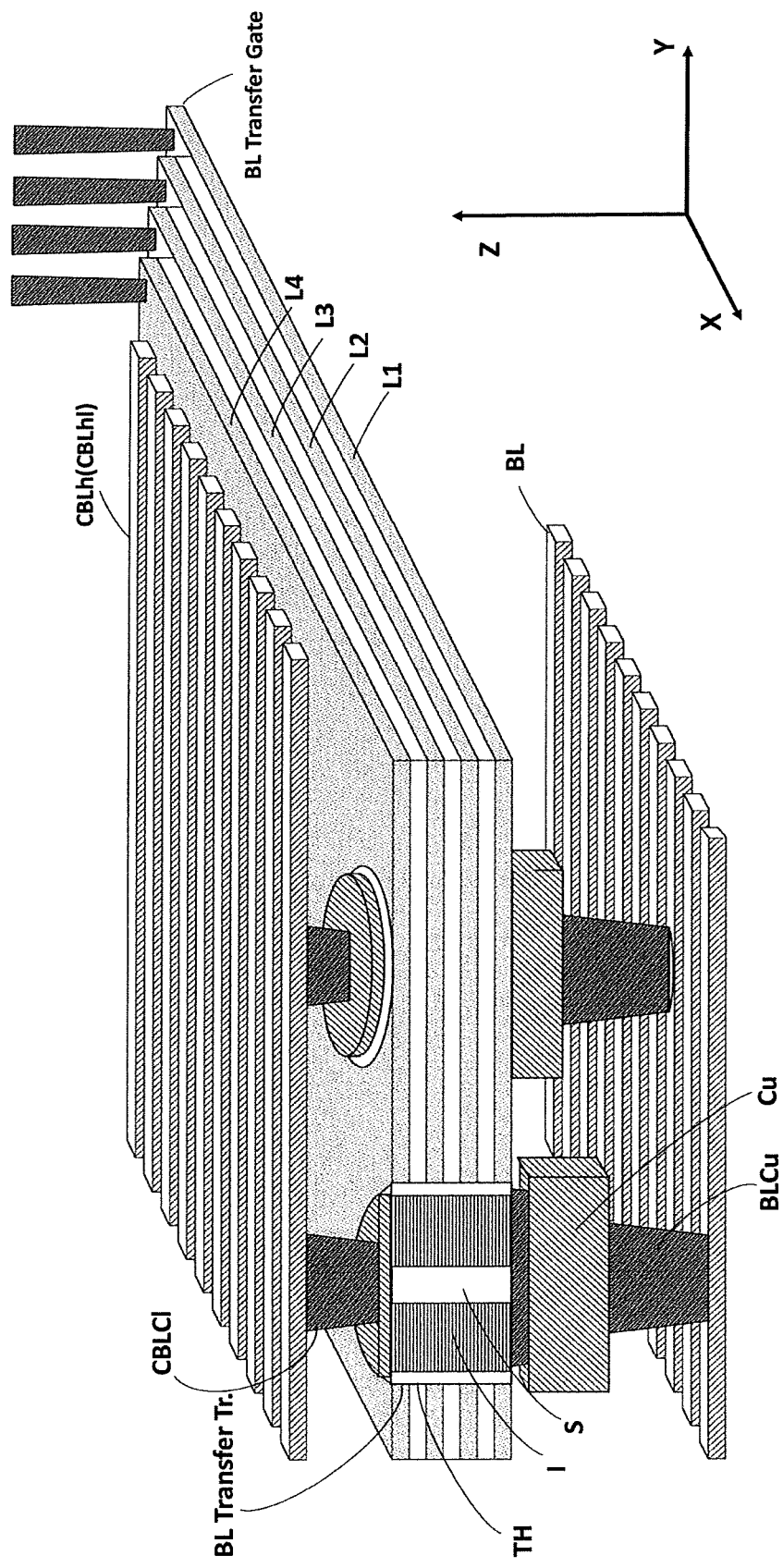
FIG. 7 is a perspective view showing a structure of a Bit line transfer transistor according to the present embodiment.

FIG. 7 is a perspective view of the Bit line transfer transistor BL Transfer Tr. corresponding to each BUNCH (FIG. 5 shows the case that the number of layers of the Bit line transfer transistor BL Transfer Gate is 2 for simplicity, but FIG. 7 shows the case, as an example, the number of layers of the Bit line transfer transistor BL Transfer Gate is 4 (L1 to L4). The number of layers of the Bit line transfer transistor BL Transfer Gate is arbitrary.)

The Bit line transfer transistor BL Transfer Tr. is formed in a transistor hole TH that passes through a plurality of plate-shaped conductive films L1 to L4 stacked with an insulating film interposed therebetween, similarly to the NAND string formed in the memory hole MH. The insulating film I is formed on the side wall inside the transistor hole TH, and the interior of the transistor hole TH is filled with semiconductor film S. Each conductive film L1 to L4 corresponds to a Bit line transfer gate line BL Transfer Gate, and semiconductor film S corresponds to a channel of the transistor. The conductive film L is multi-layered in order to effectively connect a plurality of transistors in series to reduce the leak current at the time of turning off the Bit line transfer transistor BL Transfer Tr. At least the lowermost layer L1 of the conductive layers L1 to L4 serving as the Bit line transfer gate line BL Transfer Gate may be the same layer as the source-side selection gate line SGS (the lowermost layer thereof if there are a plurality of layers). Alternatively, when the source-side selection gate line SGS is formed of four layers, four layers of the source-side selection gate lines SGS and four layers of the Bit line transfer gate lines BL Transfer Gate may be formed in the same layers, respectively.

The Bit line transfer transistor BL Transfer Tr. is connected to the Bit line BL by a Bit line contact BLCu and a contact conductive film Cu. In addition, the Bit line transfer transistor BL Transfer Tr. is connected to the common Bit line CBLh and the vertical common Bit lines CBL by a common Bit line contact CBLC1. The common Bit line CBLh includes a common Bit line CBLhl formed by the zero layer metal wiring M0, a common Bit line CBLhm formed by the first layer metal wiring M1, and a common Bit line CBLhu formed by the second layer metal wiring M2. The zero layer metal wiring M0 is a wiring formed at the same position in the Z direction as the Bit line BL. The first layer metal wiring M1 is a wiring formed at a position higher in the Z direction than the zero layer metal wiring M0. The second layer metal wiring M2 is a wiring formed at a position higher in the Z direction than the first layer metal wiring M1. That is, the first layer metal wiring M1 is higher than the zero layer metal wiring M0, and the second layer metal wiring M2 is higher than the first layer metal wiring M1 in the Z direction. The common Bit lines CBLhl are arranged in the Y-direction at the same pitch as the Bit lines BL.

In the present embodiment, the Bit line transfer transistor BL Transfer Tr. is shown as a vertical semiconductor. However, and not limited to this, the Bit line transfer transistor BL Transfer Tr. may be a fin-type semiconductor in which gate is positioned to encompass the channels and form a double gate configuration. The fin-type semiconductor may be, for example, fully depleted silicon-on-insulators (FD-SOI) on a buried silicon oxide film.

Figure 8:
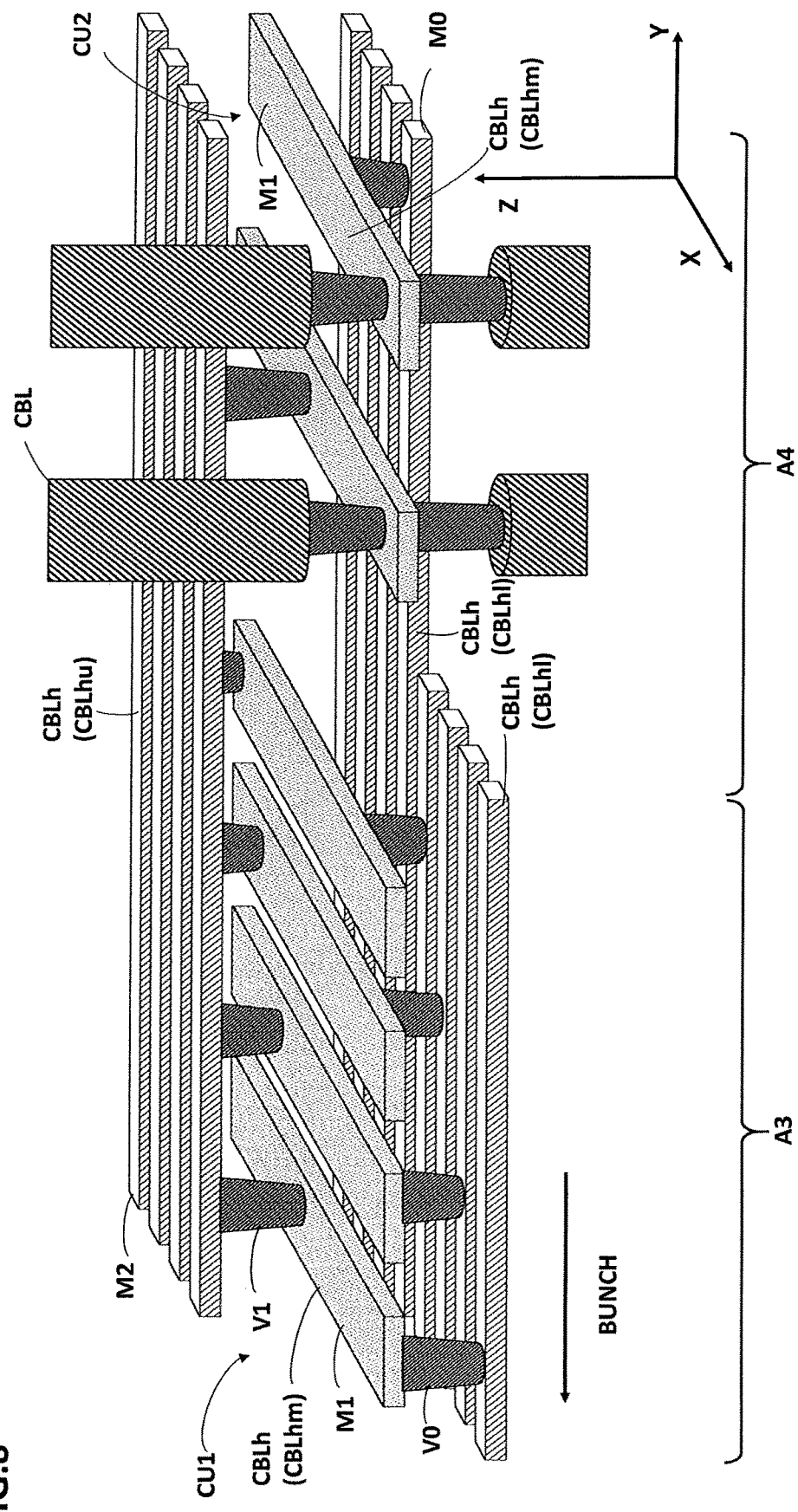
FIG. 8 is a perspective view of a connection unit according to the present embodiment.
Figure 9:
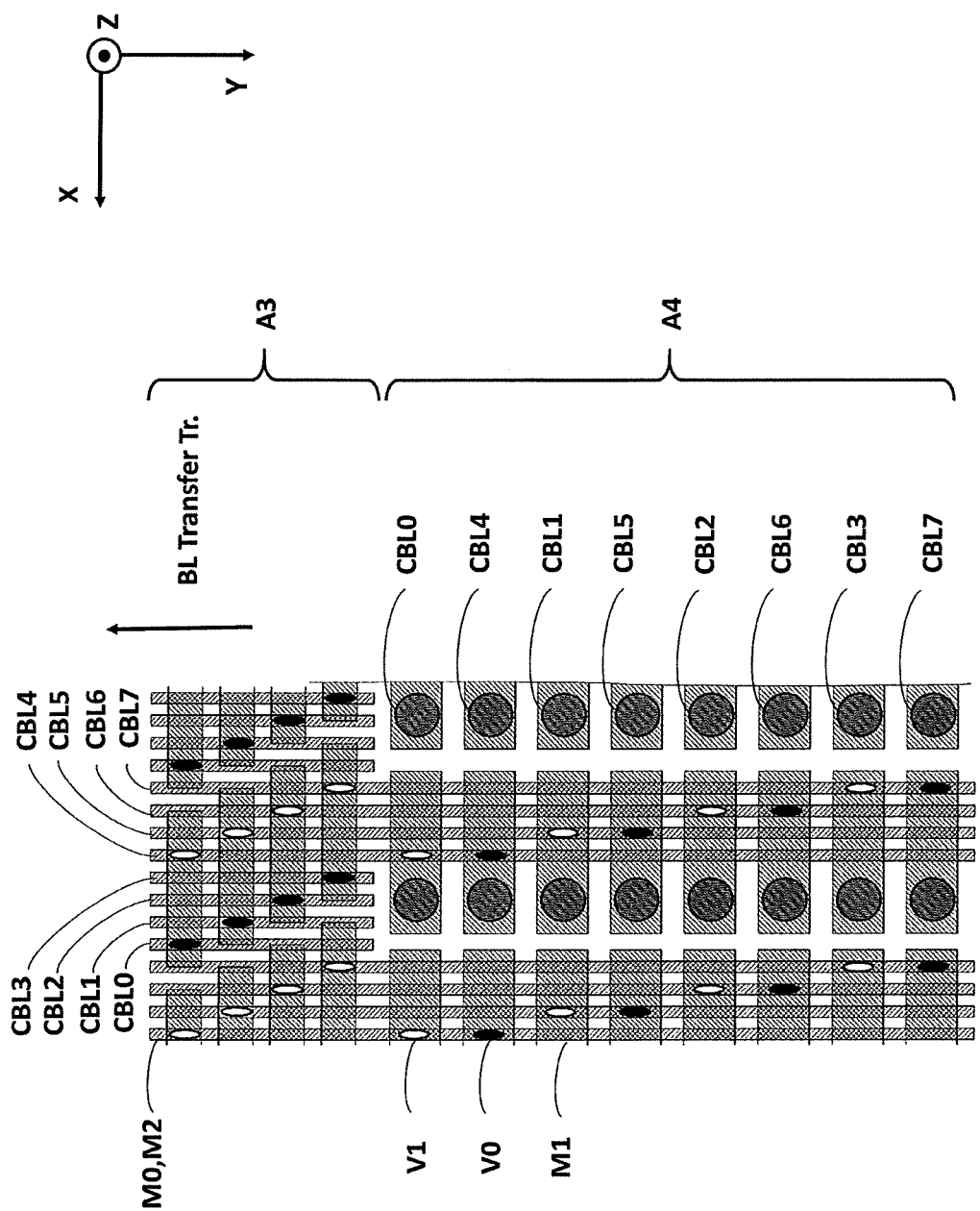
FIG. 9 is a plan view of a connection unit according to the present embodiment.

FIG. 8 is a perspective view of a connection unit CU corresponding to every BUNCH, FIG. 9 is a plan view (XY-plane) thereof. The connection unit CU includes a connection unit CU1 for connecting the vertical common Bit lines CBL0 to CBL3 to the Bit lines BL of each bunch, and a connection unit CU2 for connecting the vertical common Bit lines CBL4 to CBL7 to the Bit line BL of each bunch. The connection unit CU1 routes half of the common Bit line CBLhl (M0) running in parallel in the Y-direction at the same pitch with the Bit line BL to the common Bit line CBLhm (M1) by the via plug V0, the common Bit line CBLhm (M1) to the common Bit line CBLhu (M2) by the via plug V1, the common Bit line CBLhu (M2) to the common Bit line CBLhm (M1) by the via plug V1, and the common Bit line CBLhm (M1) is connected to the vertical common Bit line CBL. That is, the connection unit CU1 switches the half of the common Bit lines CBLhl to the common Bit lines CBLhu running in parallel above the other half of the common Bit lines CBLhl in the connection region A3, respectively, as if it is a junction of a highway. Thereby, a region where the common Bit line CBLhl does not exist can be secured in the vertical common Bit line region A4 adjacent to the connection region A3, and the vertical common Bit line CBL can be arranged in this region.

The common Bit lines CBLhl are formed by the zero layer metal wiring M0, the common Bit lines CBLhm are formed by the first layer metal wiring M1, and the common Bit lines CBLhu are formed by the second layer metal wiring M2. Half of the common Bit lines CBLhl (M0) are connected to the common Bit lines CBLhu (M2) via the common Bit lines CBLhm (M1), respectively. The common Bit lines CBLhu (M2) run in parallel above the remaining half of the common Bit lines CBLhl (M0), respectively, in the connection region A3 and the vertical common Bit line region A4. The connection unit CU1 includes the common Bit lines CBLhm (M1) in the connection region A3. The common Bit lines CBLhm (M1) in the connection region A3 function as a part of the transfer wiring. The common Bit lines CBLhm (M1) each has a stripe shape, and the extending direction (X direction) thereof is perpendicular to the extending direction (Y direction) of the common Bit lines CBLhl and CBLhu. The common Bit lines CBLhl (M0) and the common Bit lines CBLhm (M1) are connected by the via plugs V0, respectively, and the common Bit lines CBLhu (M2) and the common Bit lines CBLhm (M1) are connected by the via plugs V1, respectively.

The connection unit CU2 routes the remaining half of the common Bit lines CBLhl (M0) that are not included in the connection unit CU1 to the common Bit lines CBLhm (M1) by the via plugs V0, respectively in the vertical common bit line region A4, and the common Bit lines CBLhm (M1) are connected to the vertical common Bit lines CBL, respectively. Like the connection unit CU1, the connection unit CU2 also includes the common Bit lines CBLhm formed by the first layer metal wiring M1, in the vertical common bit line region A4.

FIG. 9 is a plan view showing eight common Bit line CBLs (CBL0~CBL7) drawn from the Bit line transfer transistors and oriented vertically. The black ellipse in the figure shows via plug V0 and the white ellipse in the figure shows via plug V1. As an example of the connection, the CBL0 (M0) drawn from the Bit line transfer transistor is connected to the second layer metal wiring (M2) through the via plug V0, the first layer metal wiring (M1), and the via plug V1 in the connecting region A3, which is connected to the common Bit line CBL0 running vertically through the via plug V1, the first layer metal wiring (M1) in the vertical common Bit line region A4. The CBL4 (M0) drawn from the Bit line transfer transistor is connected to the common Bit line CBL4 running vertically through via plug V0 and the first layer metal wiring (M1) in the vertical common Bit line region A4 as the underlying metal wiring.

Figure 10:
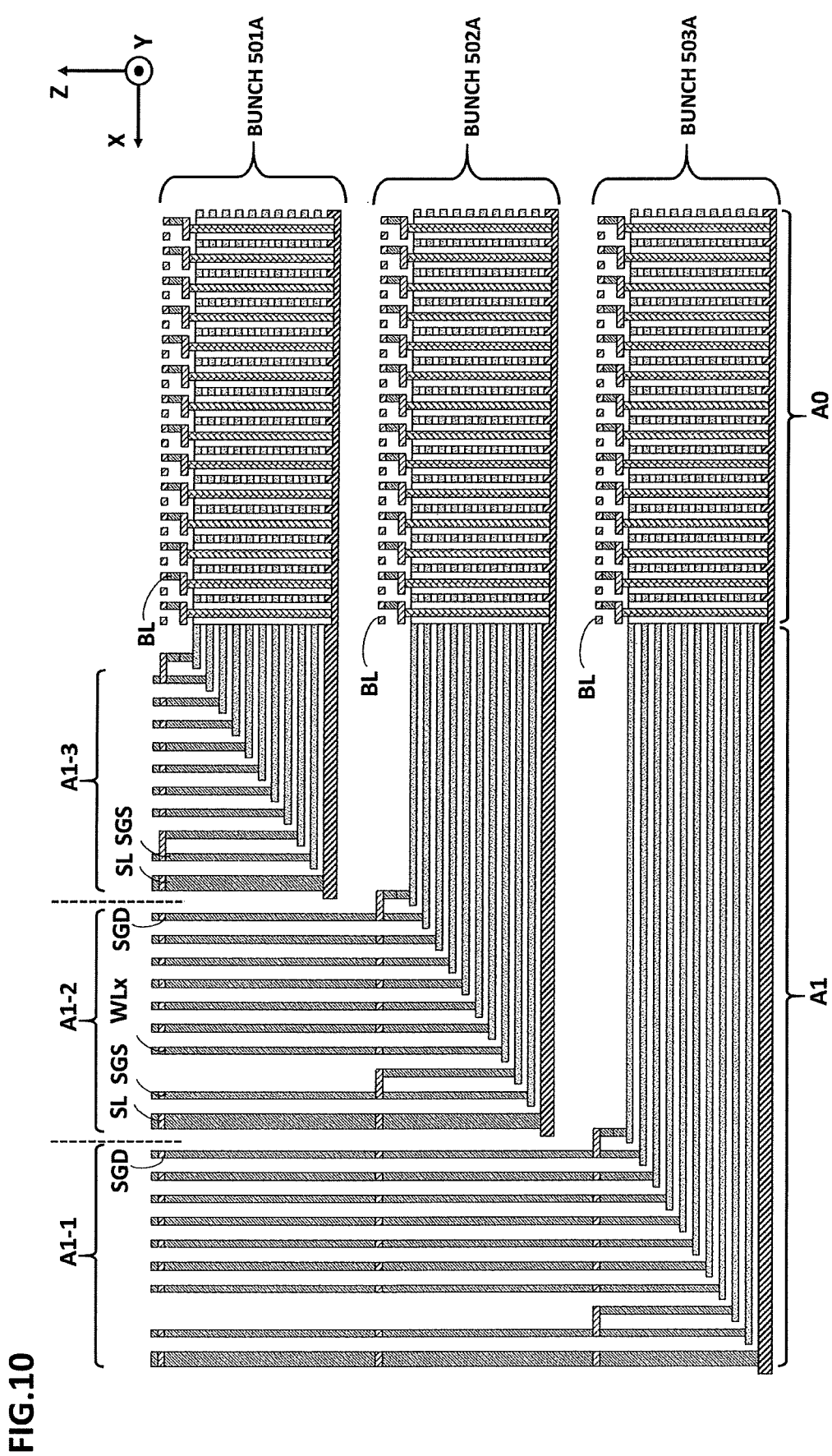
FIG. 10 is a cross-section showing a configuration of a drawn region according to the present embodiment.

FIG. 10 is a cross-section (XZ plane) of a stacked body including the BUNCH501, 502, 503. As described above, a drawn region A1 is provided adjacent to the memory cell array region A0 of the BUNCH501, 502, 503. In the drawn region A1, the drain-side selection gate line SGD, the word line WL1, WL2 . . . WLx, the source-side selection gate line SGS, and the Source line SL are each formed by drawing out terminals in a stair-like manner. A vertical drain side selection gate line SGD, a source side selection gate line SGS, a Source line SL, and a word line WL are connected to the respective terminals through contact holes opened from the upper part of the BUNCH to the insulating film. These vertical word lines are connected to wiring on the upper layer of the BUNCH501 of the stacked top layer and are connected to various drive circuits of the row system. Here, since the various control lines of the row system (drain side selection gate line SGD, word line WL, source side selection gate line SGS, Source line SL) differ for each BUNCH, it is required to provide a vertical control line wiring region A1-1~A1-3 for each BUNCH.

Correspondence Between the Common Bit Line and the Bit Line

Figure 11:
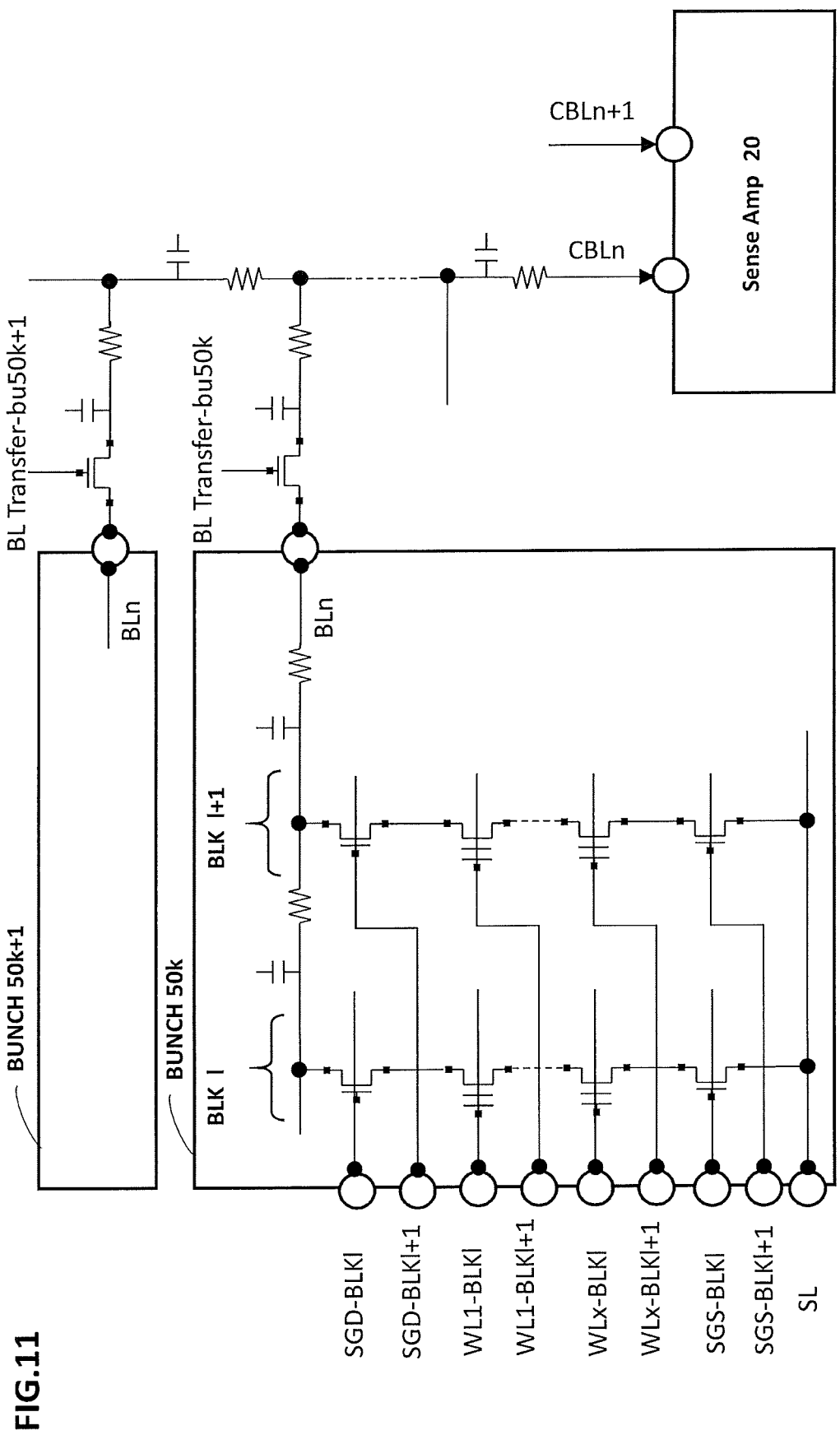
FIG. 11 is a circuit block diagram showing a configuration of a memory cell array according to the present embodiment.
Figure 12:
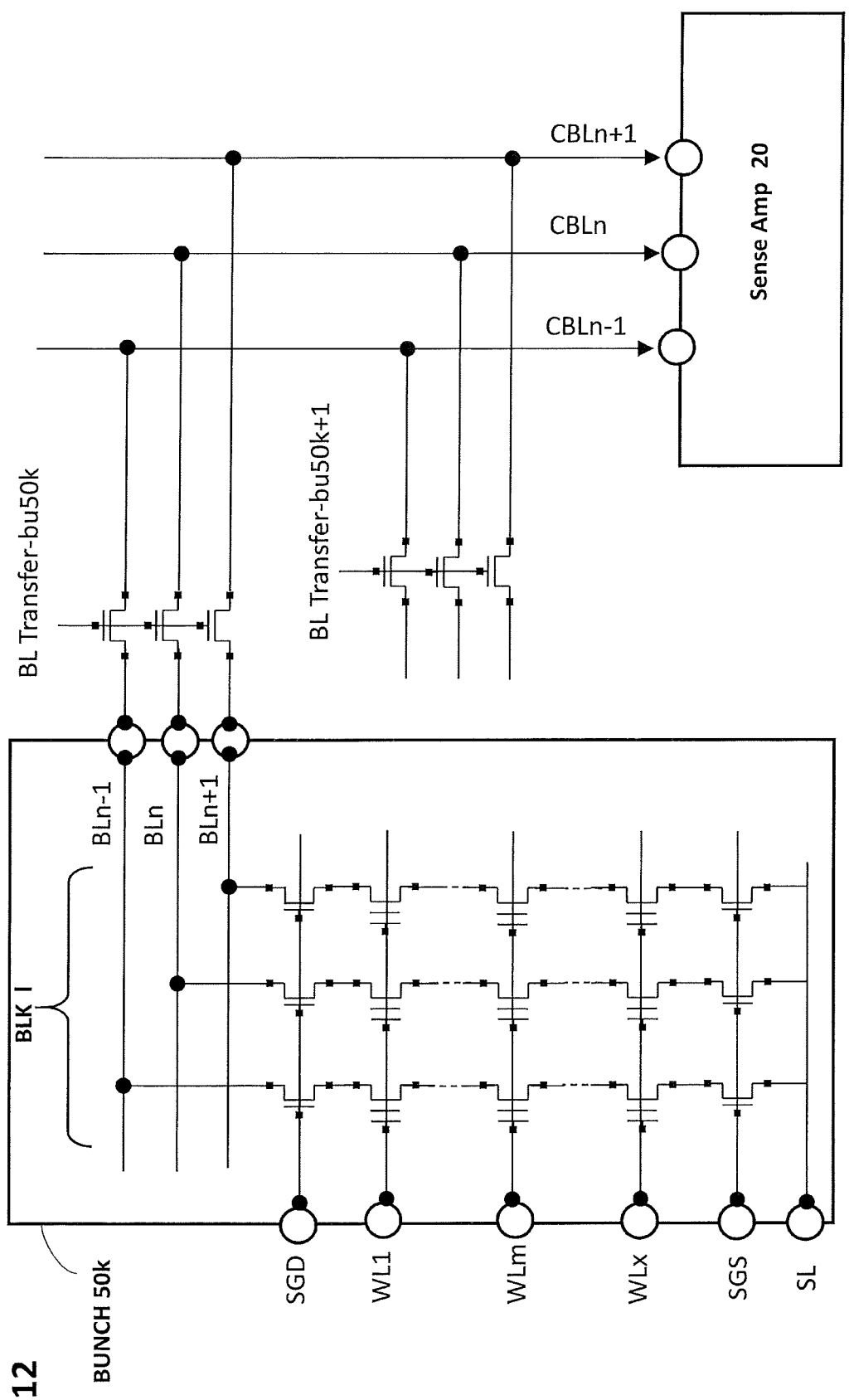
FIG. 12 is a circuit block diagram showing a configuration of a memory cell array according to the present embodiment.

FIG. 11 and FIG. 12 show the correspondence between the common Bit line and the Bit line. FIG. 11 corresponds to FIG. 3 of the first embodiment. Circuit symbols of resistance and capacity indicate a parasitic resistance and a parasitic capacitance. The memory cell array is divided into a plurality of blocks BLK by WL-SLIT in the Y-direction. As shown in FIG. 11, the memory strings belonging to the different blocks BLK are controlled by the different word lines WL, the source side selection gate lines SGS, and the drain side selection gate lines SGD. The plurality of blocks BLK (BLKI, BLKI+1 . . . ) are connected to a common Bit line BLn. The Bit line BLn drawn from the plurality of stacked BUNCH is connected to one common Bit line CBLn through the Bit line transfer transistors (BL Transfer-bu50$k$, BL Transfer-bu50$k$+1 . . . ).

FIG. 12 is a circuit diagram focusing on a memory string arranged in the X direction of the first embodiment. The memory strings belonging to the same block BLKI are connected to different Bit lines BL (BLn−1, BLn, BLn+1 . . . ). The Bit line BLn (BLn−1, BLn, BLn+1 . . . ) drawn from the plurality of stacked BUNCH is respectively connected to a plurality of common Bit line CBLn−1, CBLn, CBLn+1 via a plurality of Bit line transfer transistors (BL Transfer-bu50$k$, BL Transfer-bu50$k$+1 . . . ).

The Operation Waveform (Read Operation)

Figure 13:
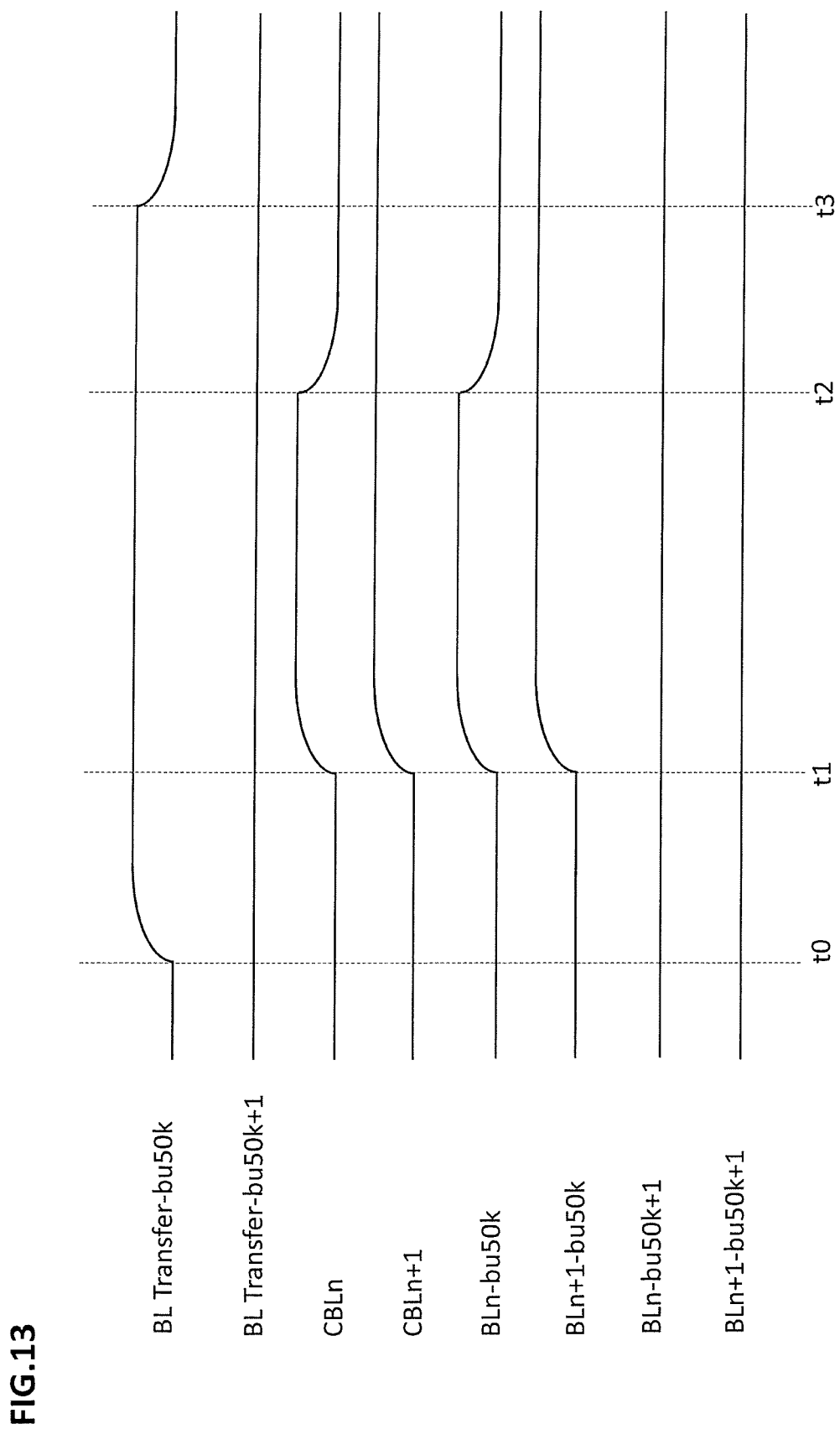
FIG. 13 is a diagram showing voltages supplied to each signal line during read operation in a semiconductor memory device according to the present embodiment.

FIG. 13 is a diagram showing a voltage supplied to each signal line during a read operation in the semiconductor memory device according to the present embodiment.

The read operation has three stages, t0 to t1, t1 to t2, and t2 to t3. Between t0 and t1 is the period in which the gates of the selected BUNCH50$k$ are opened, between t1 and t2 is the precharge period, and between t2 and t3 is the read period for determining the data of the memory cells.

At time t0, a signal is supplied to the Bit line transfer transistor BL Transfer Tr. (BL Transfer-bu50$k$) of the selected BUNCH50$k$ to increase the voltage of the gate. The gates of the Bit line transfer transistor BL Transfer Tr. (BL Transfer-bu50$k$+1) of the non-selected BUNCH50$k$+1 remain 0V.

Charge all common-Bit lines CBL (CBLn, CBLn+1 . . . ) at time t1. The Bit line (BLn-bu50$k$, BLn+1-bu50$k$ . . . ) of the selected BUNCH50$k$ is charged. The Bit line (BLn-bu50$k$+1, BLn+1-bu50$k$+1 . . . ) of the non-selected BUNCH50$k$+1 remains 0V.

At time t2, the threshold voltage of the memory cell specified by the word line WLm of the specified block BLKI of the BUNCH50$k$ to be accessed can be determined by determining whether or not the Bit line BL (BLn-bu50$k$) and the common Bit line CBL (CBLn) connected to the written memory cell discharge by the sense amplifier 20 when the word line WL is raised to the read voltage and the SG gate is opened.

The Effect of Semiconductor Memory Device According to the First Embodiment

The semiconductor memory device according to the present embodiment has a stacked structure in which the plurality of the BUNCH are stacked, and thus the memory storage capacity per unit area can be increased, and the number of storage devices that can be taken from a single Silicon Wafer can be increased. By arranging the Bit lines for each BUNCH, even if the number of memory layers increases, the block size to be erased at one time does not change, thereby inhibiting the increase in the loading capacity during erasing. By arranging the Bit lines for each BUNCH, even if the number of memory layers increases, the reduction of the current flowing to the memory cell can be suppressed, and the speeds of data reading, data writing, and data erasing can be improved.

By connecting the Bit lines BL of each BUNCH to the shared common Bit line CBL, the chip area can be reduced compared with the vertical pull-out of all the Bit lines BL, and the memory storage capacity per unit area can be increased.

By connecting the Bit lines BL of each BUNCH to the Bit line transfer transistor, the blocks of cell arrays to connect can be select. Therefore, even if the common Bit line CBL is shared with the Bit line BL of the upper and lower bunches, the parasitic capacitance and parasitic resistance of all the Bit line BL of the memory bunches are not connected to the Bit line BL, and the Bit line BL capacity can be suppressed, thereby the speed of data reading, data writing, and data erasing can be improved.

By connecting the Bit lines BL of each BUNCH to the common Bit line through the transfer wiring of the connection unit connected vertically to the common Bit line over the Bit line BL, the area in which the common Bit line CBL is placed can be allocated, and the memory storage capacity per unit area can be increased.

The Semiconductor Memory Device According to the Second Embodiment

Figure 14:
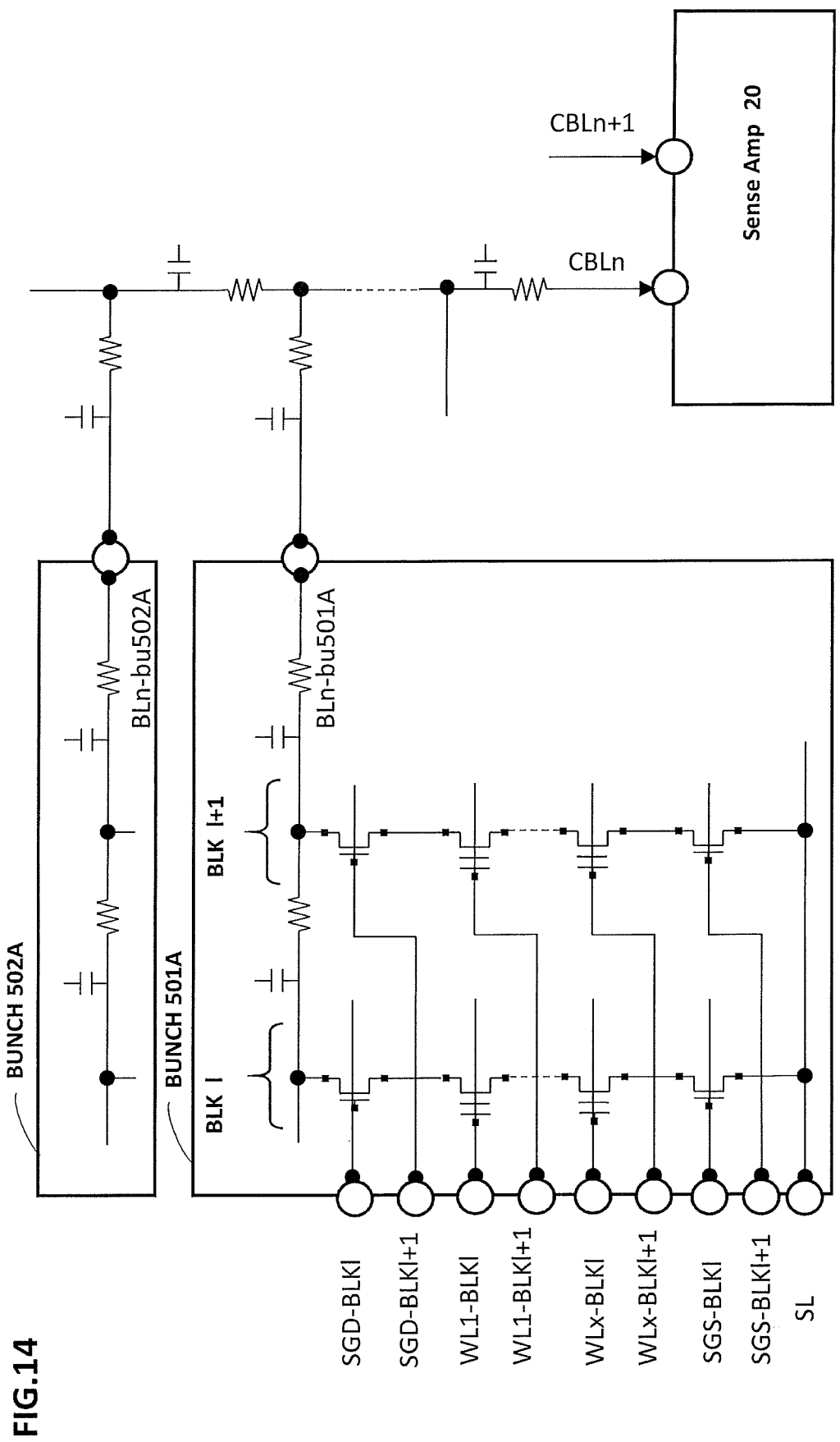
FIG. 14 is a circuit block diagram showing a configuration of a memory cell array according to the present embodiment.

The configuration of the semiconductor memory device according to the present embodiment will be described with reference to FIGS. 14 to 16. In the present embodiment, since it is the same as the first embodiment except that it does not have a Bit line transfer transistor BL Transfer Tr, a repetition of the description will be omitted.

The Circuit Configuration of the Memory Cell Array

The circuit configuration of the memory cell array 100A according to the present embodiment will be described with reference to FIG. 14. FIG. 14 is a circuit block diagram showing a configuration of a memory cell array included in the semiconductor memory device according to the present embodiment. The memory cell array 100A includes a plurality of BUNCH501A, BUNCH502A.

Each of the BUNCH contains a plurality of blocks (BLKI, BLKI+1 . . . I is an integral number of 1 or more). Each of the blocks BLKs contains a plurality of NAND strings. Each of the NAND strings are connected between the corresponding Bit line BL and the Source line SL. The memory cells of the NAND strings included in the block BLKI are connected to a common drain-side selection gate line SGD-BLKI, a word line WL-BLKI, and a source-side selection gate line SGS-BLKI.

In a BUNCH501A, each of the NAND strings are connected to corresponding Bit lines BL (BLn, BLn−1 . . . n is an integral number of 1 or more) that is shared among the blocks BLK. In the BUNCH501A, all NAND strings are connected to the Source line SL common to the BUNCH501A. In the memory cell array 100A, the Bit lines BL (BLn-bu501A, BLn-bu502A) arranged in the same column are connected to the common Bit line CBL (CBLn) shared among the BUNCH. The common-Bit line CBL (CBLn, CBLn+1 . . . ) is connected to the sense amplifier 20. Here, a BUNCH501A and Bit line BL (BLn-bu501A, BLn-bu502A . . . ) are explained as examples, but other BUNCH502A and Bit line BL (BLn+1-bu501A, BLn+1-bu502A . . . ) are similar circuits.

The Structure of the Memory Cell Array

The structure of the memory cell array 100A will be described with reference to FIGS. 15 and 16 to show how the Bit line BL is drawn from the stacked BUNCH and connected to the vertically shared Bit line CBL.

Figure 15:
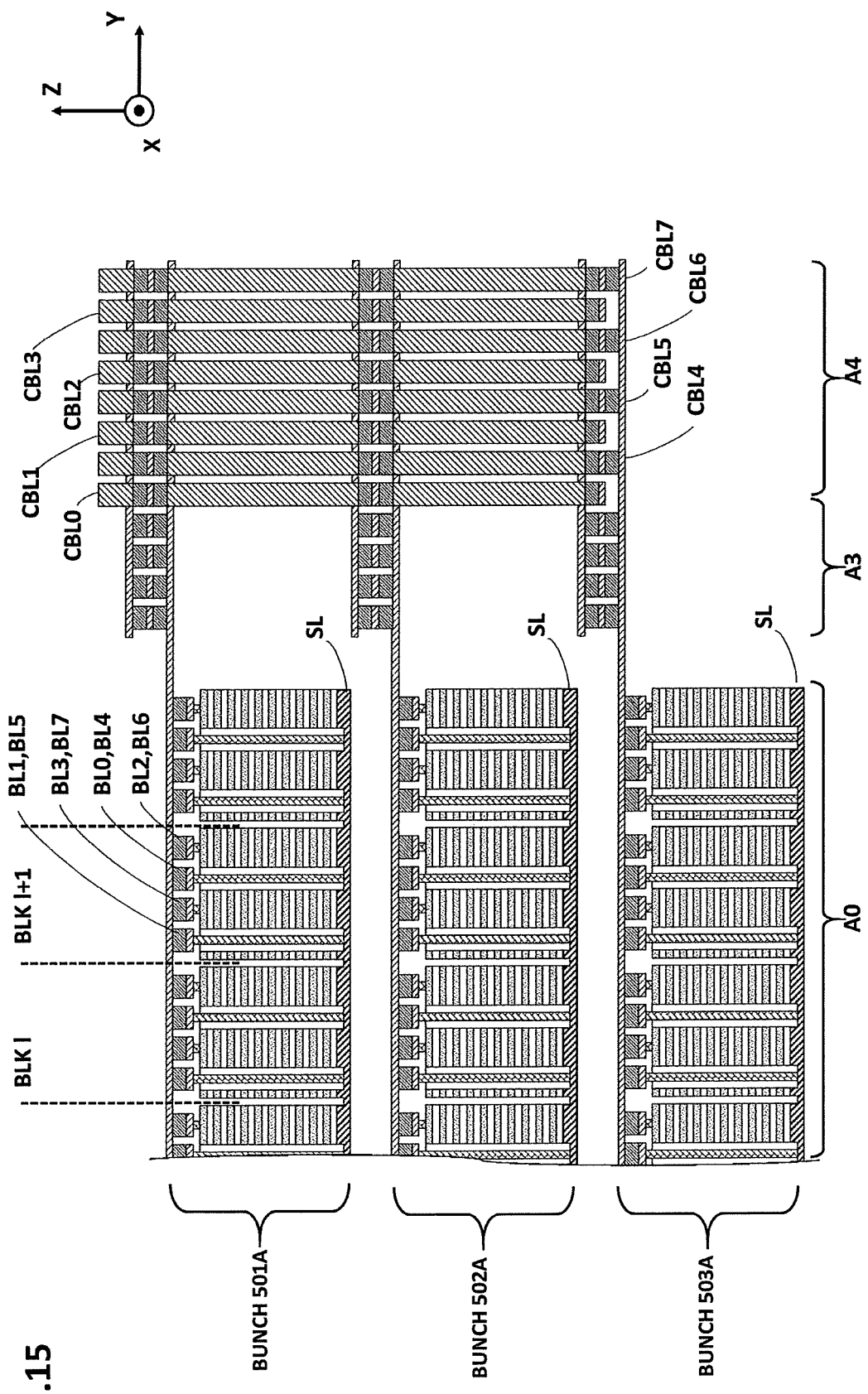
FIG. 15 is a cross-section showing a structure of a memory cell array according to the present embodiment.

FIG. 15 is a cross-section (YZ plane) of a stacked body including BUNCH501A, 502A, and 503A. The vertical common Bit lines CBL0, CBL1 . . . CBL7 are arranged in parallel in the vertical direction (Z direction), in the vertical common Bit line region A4. A connection region A3 is arranged between the memory cell array region A0 and the vertical common Bit line region A4.

Figure 16:
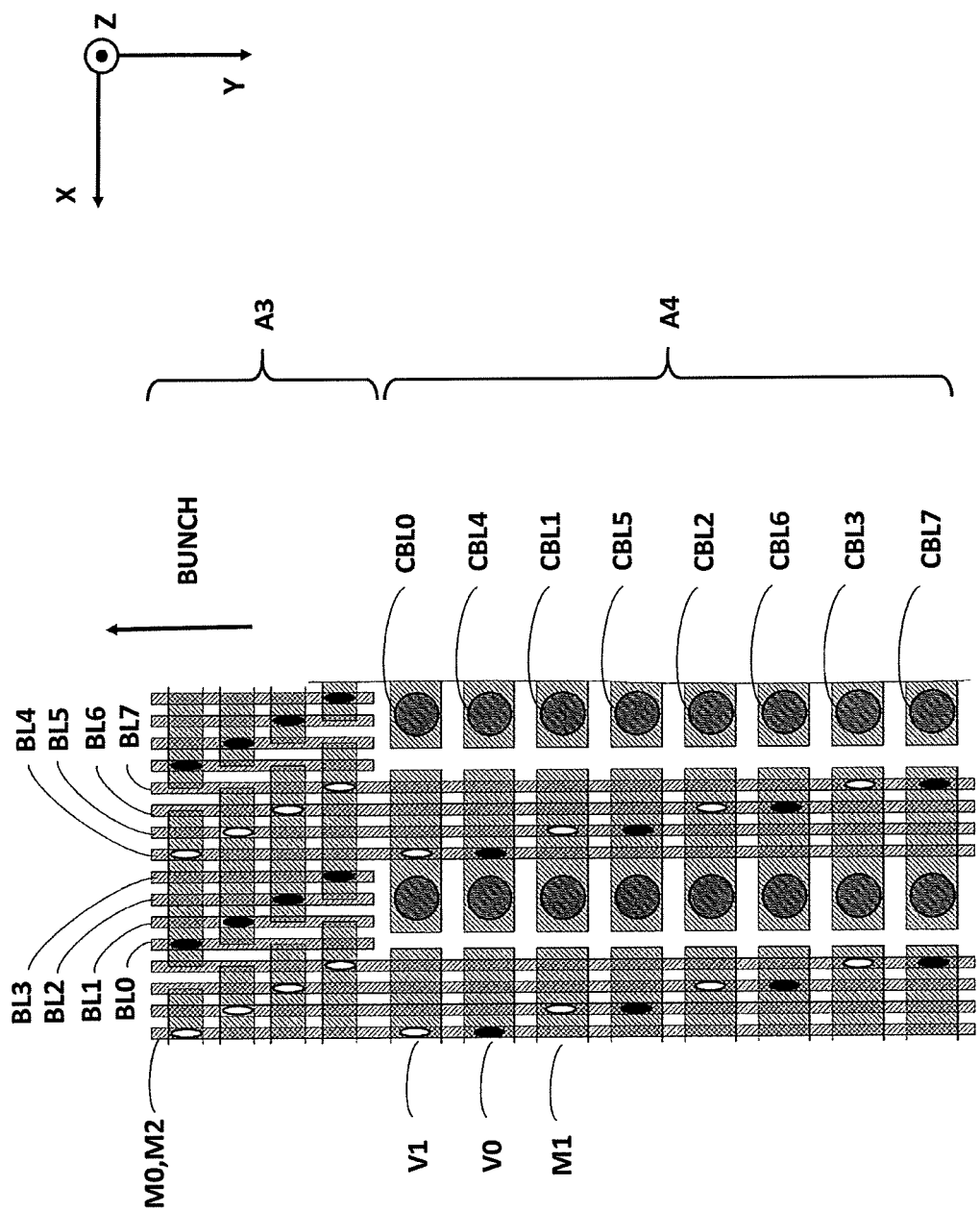
FIG. 16 is a plan view of a connection unit according to the present embodiment.

FIG. 16 is a plan view showing eight Bit line BLs (BL0~BL7) drawn from the memory cell array and oriented vertically. The black ellipse in the figure shows via plug V0 and the white ellipse in the figure shows via plug V1. As an example of a connection, the BL0 (M0) drawn from the memory cell array is connected to the second layer metal wiring (M2) through the via plug V0, the first layer metal wiring (M1), and the via plug V1 in the connection region A3, which is connected to the common Bit line CBL0 running vertically through the via plug V1 and the first layer metal wiring (M1) in the vertical common Bit line region A4. The CBL4 (M0) drawn from the memory cell array is connected to the common Bit line CBL4 running vertically through via plug V0 and the first layer metal wiring (M1) in the vertical common Bit line region A4 as the underlying metal wiring.

The Effect of Semiconductor Memory Device According to the Second Embodiment

The semiconductor memory device according to the present embodiment has a stacked structure in which the plurality of the BUNCH are stacked, and thus the memory storage capacity per unit area can be increased, and the number of storage devices that can be taken from a single Silicon Wafer can be increased. By arranging the Bit lines for each BUNCH, even if the number of memory layers increases, the block size to be erased at one time does not change, thereby inhibiting the increase in the loading capacity during erasing. By arranging the Bit lines for each BUNCH, even if the number of memory layers increases, the reduction of the current flowing to the memory cell can be suppressed and the speeds of data reading, data writing, and data erasing can be improved.

By connecting the Bit lines BL of each BUNCH to the shared common Bit line CBL, the chip area can be reduced compared with the vertical pull-out of all the Bit lines BL, and the memory storage capacity per unit area can be increased.

By connecting the Bit lines BL of each BUNCH to the common Bit line through the transfer wiring of the connection unit connected vertically to the common Bit line over the Bit line BL, the area in which the common Bit line CBL is placed can be allocated, and the memory storage capacity per unit area can be increased.

The Semiconductor Memory Device According to the Third Embodiment

Figure 17:
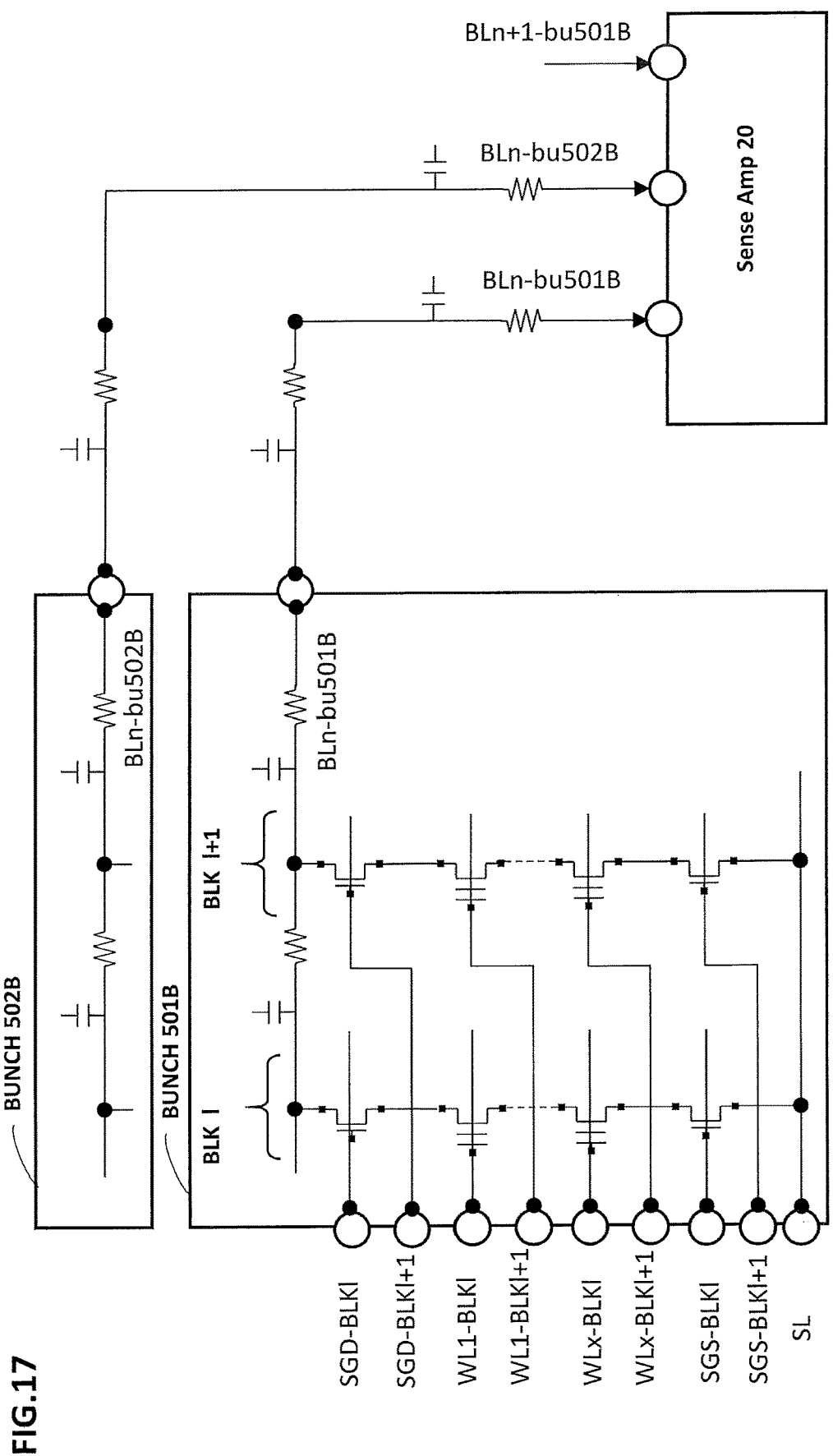
FIG. 17 is a circuit block diagram showing a configuration of a memory cell array according to the present embodiment.
Figure 18:
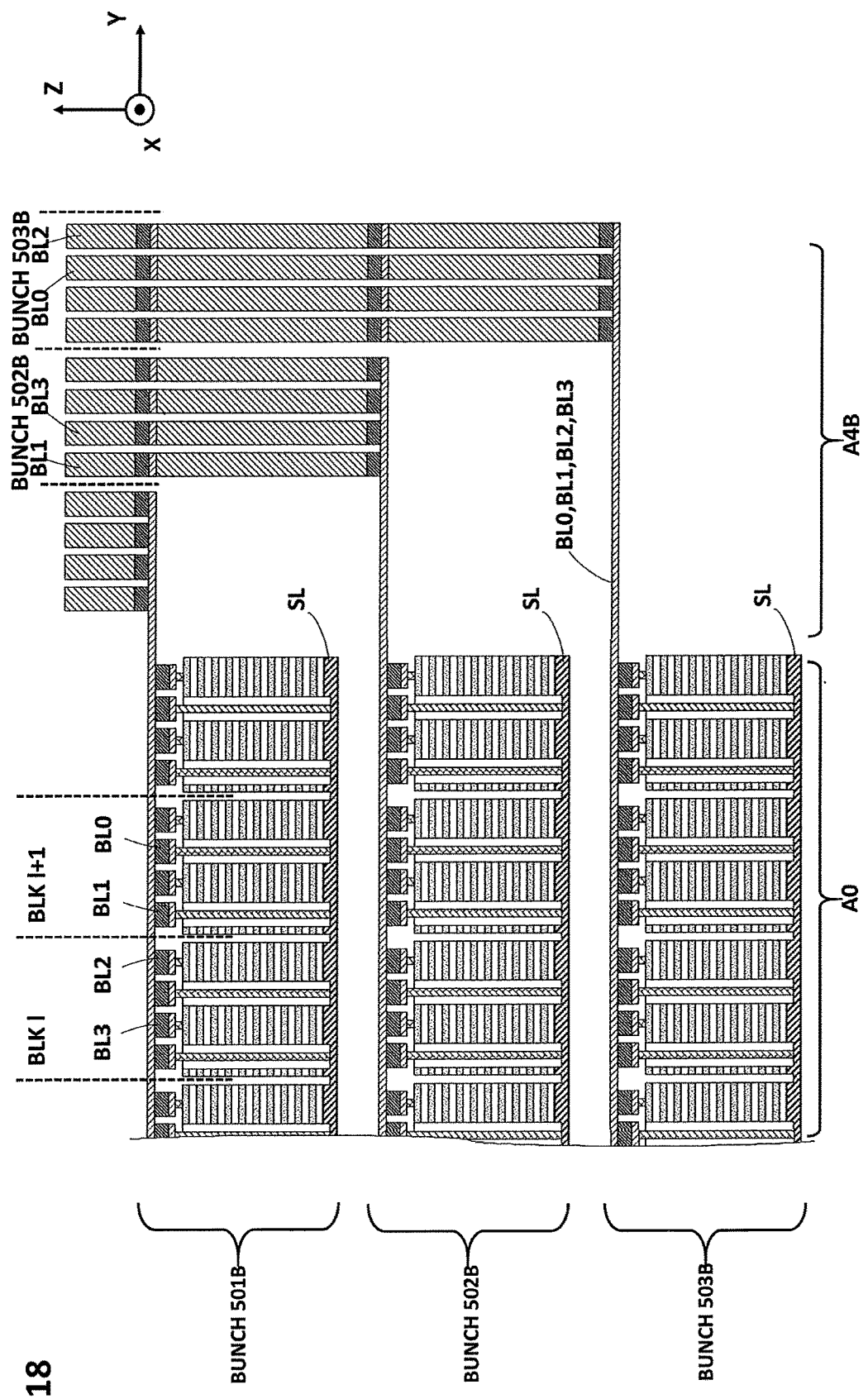
FIG. 18 is a cross-section showing a structure of a memory cell array according to the present embodiment.
Figure 19:
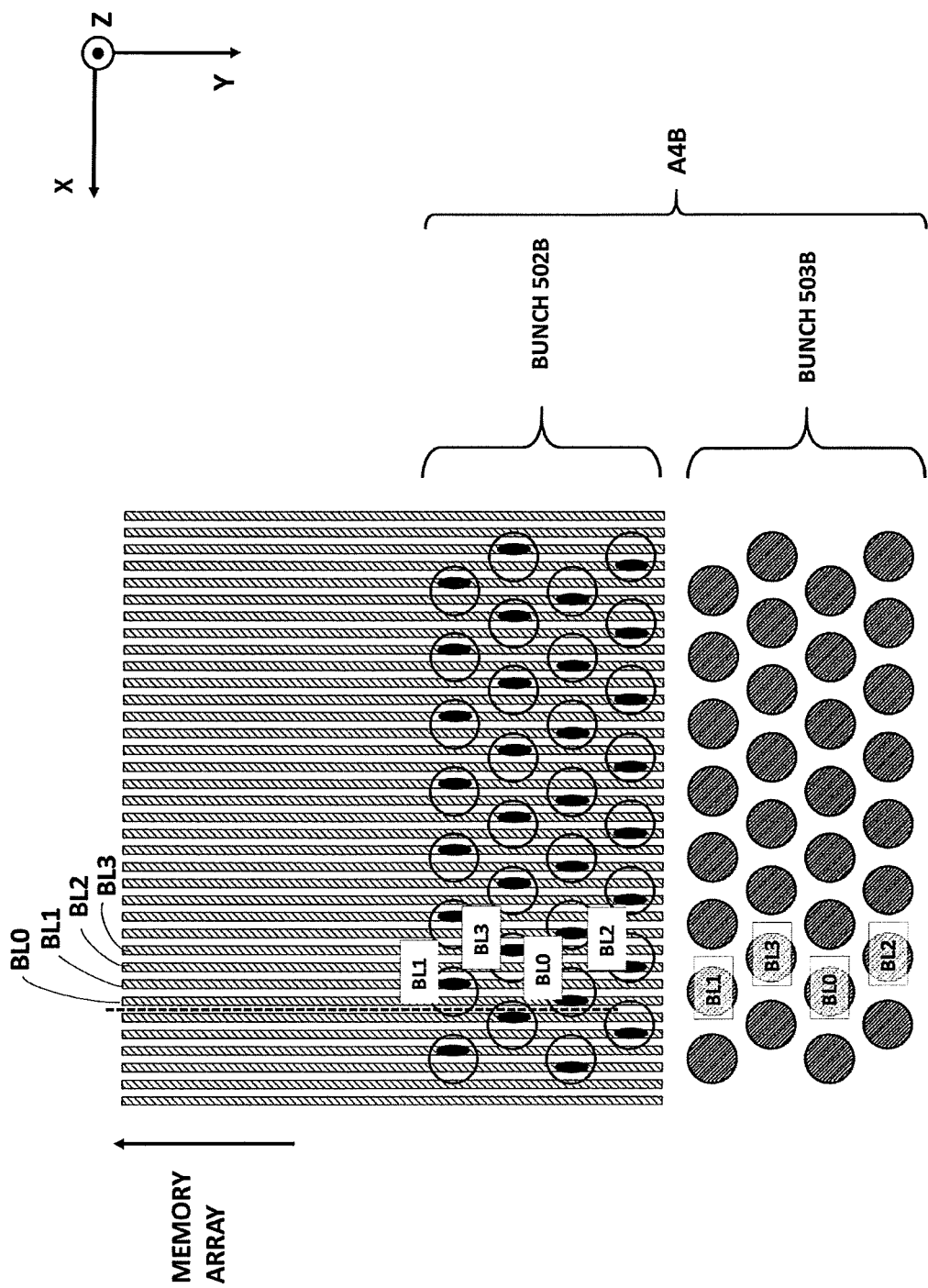
FIG. 19 is a plan view of a connection unit according to the present embodiment.

Referring to FIGS. 17 to 19, the configuration of a semiconductor memory device according to the present embodiment will be described. In the present embodiment, since it is the same as the first embodiment except that the Bit line transfer transistor BL Transfer Tr. and the common Bit line CBL are not included, a repetition of the description will be omitted.

The Circuit Configuration of the Memory Cell Array

The circuit configuration of the memory cell array 100B according to the present embodiment will be described with reference to FIG. 17. FIG. 17 is a circuit block diagram showing a configuration of a memory cell array included in the semiconductor memory device according to the present embodiment. The memory cell array 100B includes a plurality of BUNCH501B, BUNCH502B.

Each of the BUNCH contains a plurality of blocks (BLKI, BLKI+1 . . . I is an integral number of 1 or more). Each of the blocks BLKs contains a plurality of NAND strings. Each of the NAND strings are connected between the corresponding Bit lines BL and the Source line SL. The memory cells of the NAND strings included in the block BLKI are connected to a common drain-side selection gate line SGD-BLKI, a word line WL-BLKI, and a source-side selection gate line SGS-BLKI.

In a BUNCH501B, each of the NAND strings are connected to corresponding Bit lines BL (BLn, BLn+1 . . . n is an integral number of 1 or more) that is shared among the blocks BLK. In the BUNCH501B, all NAND strings are connected to the Source line SL common to the BUNCH501B. In the memory cell array 100B, each of the Bit lines BL (BLn-bu501B, BLn-bu502B) are connected to the sense amplifier 20 via a vertical Bit lines BL. Here, a BUNCH501B and Bit line BL (BLn-bu501B, BLn-bu502B . . . ) are explained as examples, but other BUNCH502B and Bit line BL (BLn+1-bu501B, BLn+1-bu502B . . . ) are similar circuits.

The Structure of the Memory Cell Array

The structure of the memory cell array 100B will be described with reference to FIGS. 18 and 19 to show how the Bit line BL is drawn from the stacked BUNCH and connected to the vertical Bit line BL.

FIG. 18 is a cross-section (YZ plane) of a stacked body including BUNCH501B, including 502B, and 503B. The vertical Bit line BL0, BL1 . . . BL3 are arranged in parallel in the vertical direction (Z direction) in the vertical Bit line region A4B.

FIG. 19 is a plan view showing four Bit line BLs (BL0~BL3) drawn from the memory cell array and vertically oriented. In the vertical Bit line region A4B, two groups of vertical Bit lines BL arranged in a staggered pattern with a shift of ½ pitch are arranged in parallel in the X-direction for each BUNCH. The Bit lines BL are parallel in the Y direction, and their pitch is ¼ of that of the vertical Bit line BL. The part indicated by the black ellipse in the figure is the Bit line contact BLC.

The Effect of Semiconductor Memory Device According to the Third Embodiment

The semiconductor memory device according to the present embodiment has a stacked structure in which the plurality of the BUNCH are stacked, and thus the memory storage capacity per unit area can be increased, and the number of storage devices that can be taken from a single Silicon Wafer can be increased. By arranging the Bit lines for each BUNCH, even if the number of memory layers increases, the block size to be erased at one time does not change, thereby inhibiting the increase in the loading capacity during erasing. By arranging the Bit lines for each BUNCH, even if the number of memory layers increases, the reduction of the current flowing to the memory cell can be suppressed, and the speeds of data reading, data writing, and data erasing can be improved.

By connecting the Bit lines BL of each BUNCH to the vertical Bit lines BL (not sharing the Bit lines BL), the parasitic capacitance and parasitic resistance of all the Bit lines BL are not connected to the Bit lines BL, and the Bit line BL capacity can be suppressed, thereby the speed of data reading, data writing, and data erasing can be improved.

The Semiconductor Memory Device According to the Fourth Embodiment

A configuration of a semiconductor memory device according to the present embodiment will be described with reference to FIG. 20. In the present embodiment, since it is the same as the first embodiment except that the positions of the Bit line transfer transistors BL Transfer Tr. is different, repetition of the description will be omitted.

In the present embodiment, the Bit line transfer transistor BL Transfer Tr. is arranged below the Bit line BL. The Bit line transfer transistor BL Transfer Tr. of the BUNCH501 may be adjacent to the drain-side selection gate transistor layers of the BUNCH501. In this case, the Bit line transfer transistor BL Transfer Tr. of the BUNCH501 may be formed in the same layers by the same processes as the drain-side selection gate transistor of the BUNCH501. However, and not limited to this, the Bit line transfer transistor BL Transfer Tr. may be formed on the same layer by the same processes as any layer below the Bit line BL or may be formed independently of the memory cell array.

Figure 20:
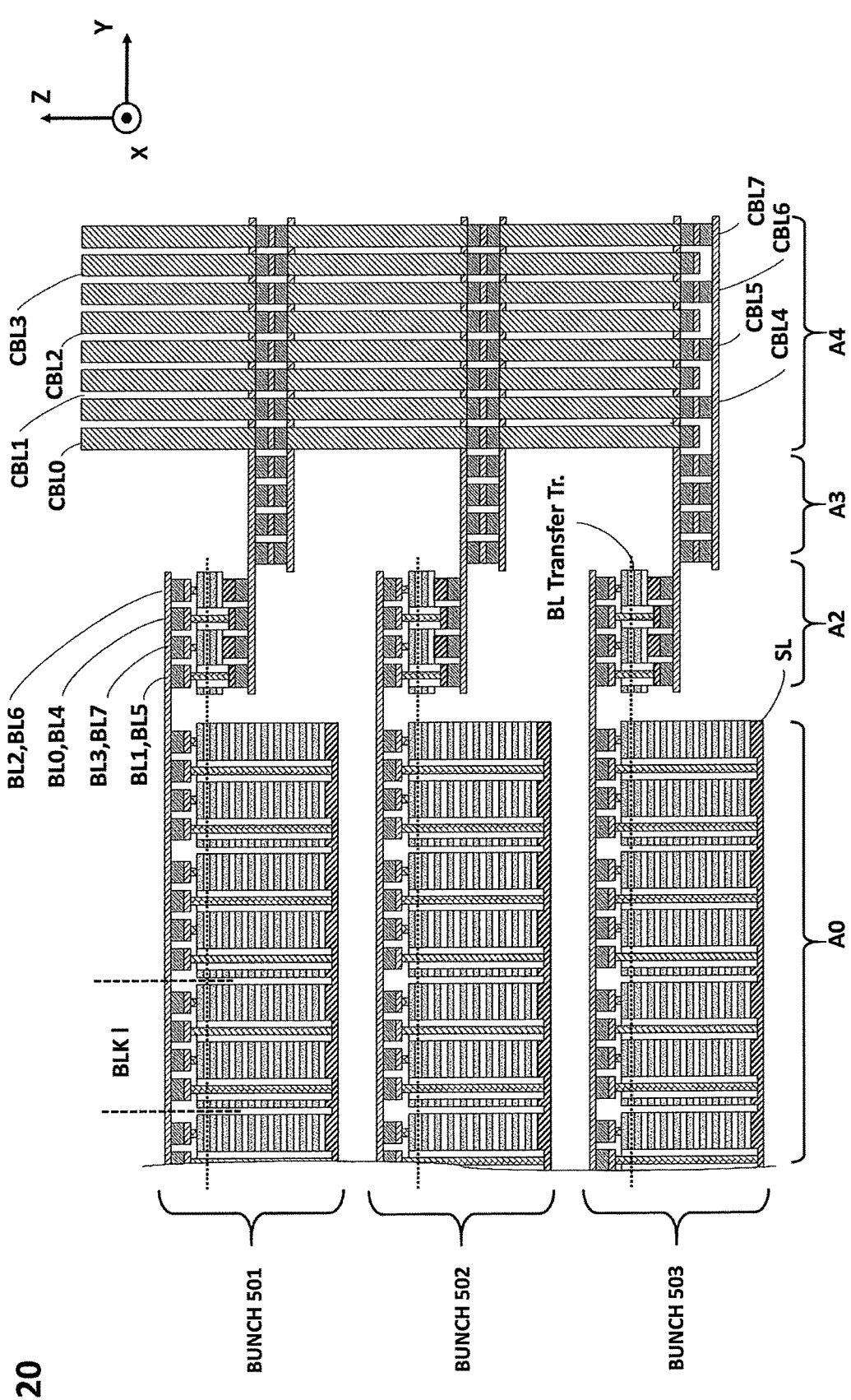
FIG. 20 is a cross-section showing a structure of a memory cell array according to the present embodiment.

In FIG. 20, the Bit line transfer transistor BL Transfer Tr. is shown as a vertical semiconductor. However, and not limited to this, the Bit line transfer transistor BL Transfer Tr. may be a fin-type semiconductor. The fin-type semiconductor may be, for example, fully depleted silicon-on-insulators (FD-SOI) on a buried silicon oxide film.

The Semiconductor Memory Device According to the Fifth Embodiment

A configuration of a semiconductor memory device according to the present embodiment will be described with reference to FIG. 21. In the present embodiment, since it is the same as the first embodiment except that the positions of the Bit line transfer transistors BL Transfer Tr. is different, repetition of the description will be omitted.

In the present embodiment, the Bit line transfer transistor BL Transfer Tr. is placed on top of the Bit line BL. A BUNCH502 Bit line transfer transistor BL Transfer Tr. is formed between the Bit line BL of the BUNCH502 and the Source line SL of the BUNCH501. The BUNCH502 Bit line transfer transistor BL Transfer Tr. may be formed on top of the BUNCH502 memory bunch. That is, in the present embodiment, the Bit line transfer transistor region A2 may be overlap with the memory cell array region A0. However, and not limited to this, the Bit line transfer transistor region A2 may be adjacent to the memory cell array region A0. That is, the Bit line transfer transistor BL Transfer Tr. may be formed in any of the regions in the regular, semi-regular, or irregular arrays.

Figure 21:
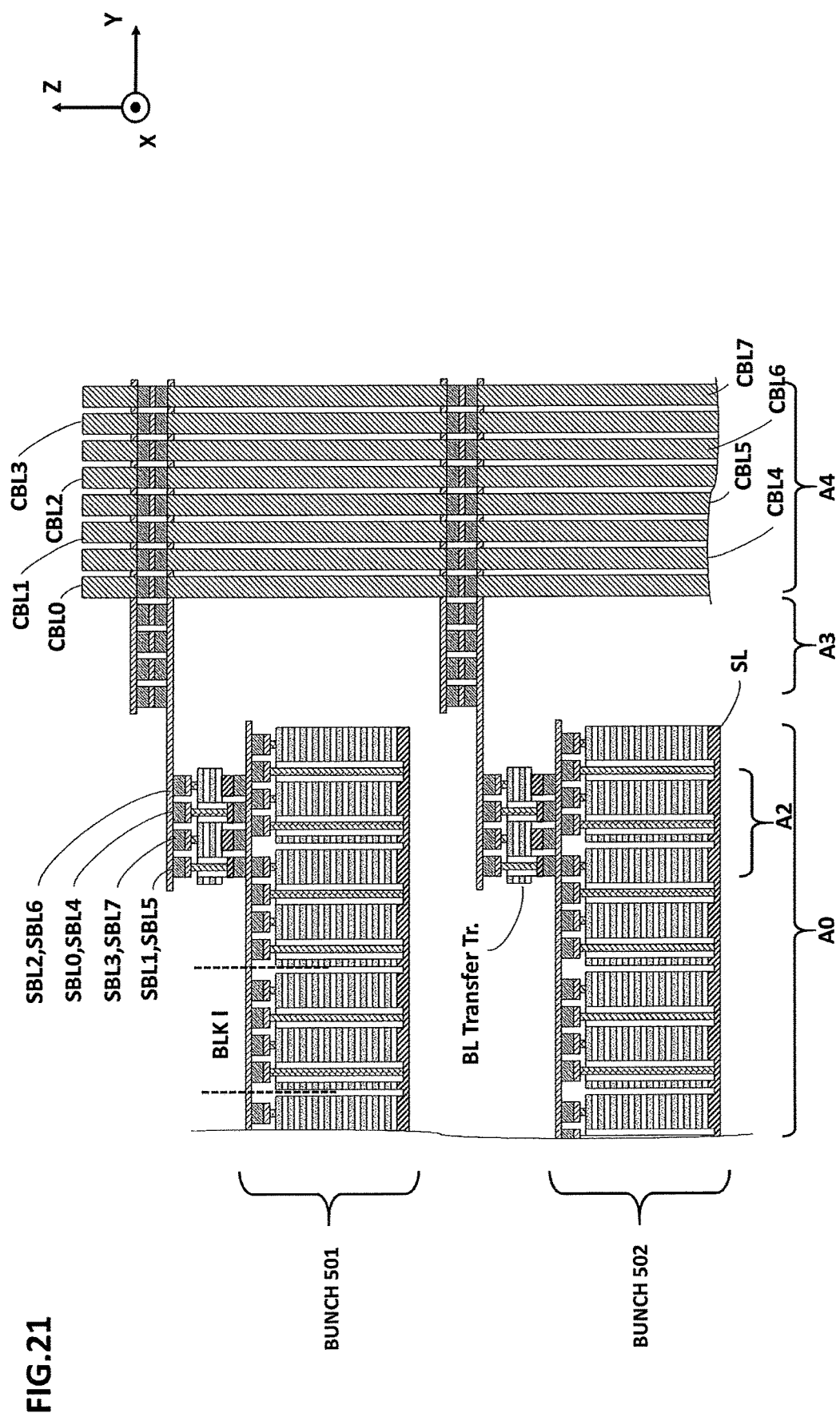
FIG. 21 is a cross-section showing a structure of a memory cell array according to the present embodiment.

In FIG. 21, the Bit line transfer transistor BL Transfer Tr. is shown as a vertical semiconductor. However, and not limited to this, the Bit line transfer transistor BL Transfer Tr. may be a fin-type semiconductor. The fin-type semiconductor may be, for example, fully depleted silicon-on-insulators (FD-SOI) on a buried silicon oxide film.

The Semiconductor Memory Device According to the Sixth Embodiment

Figure 22:
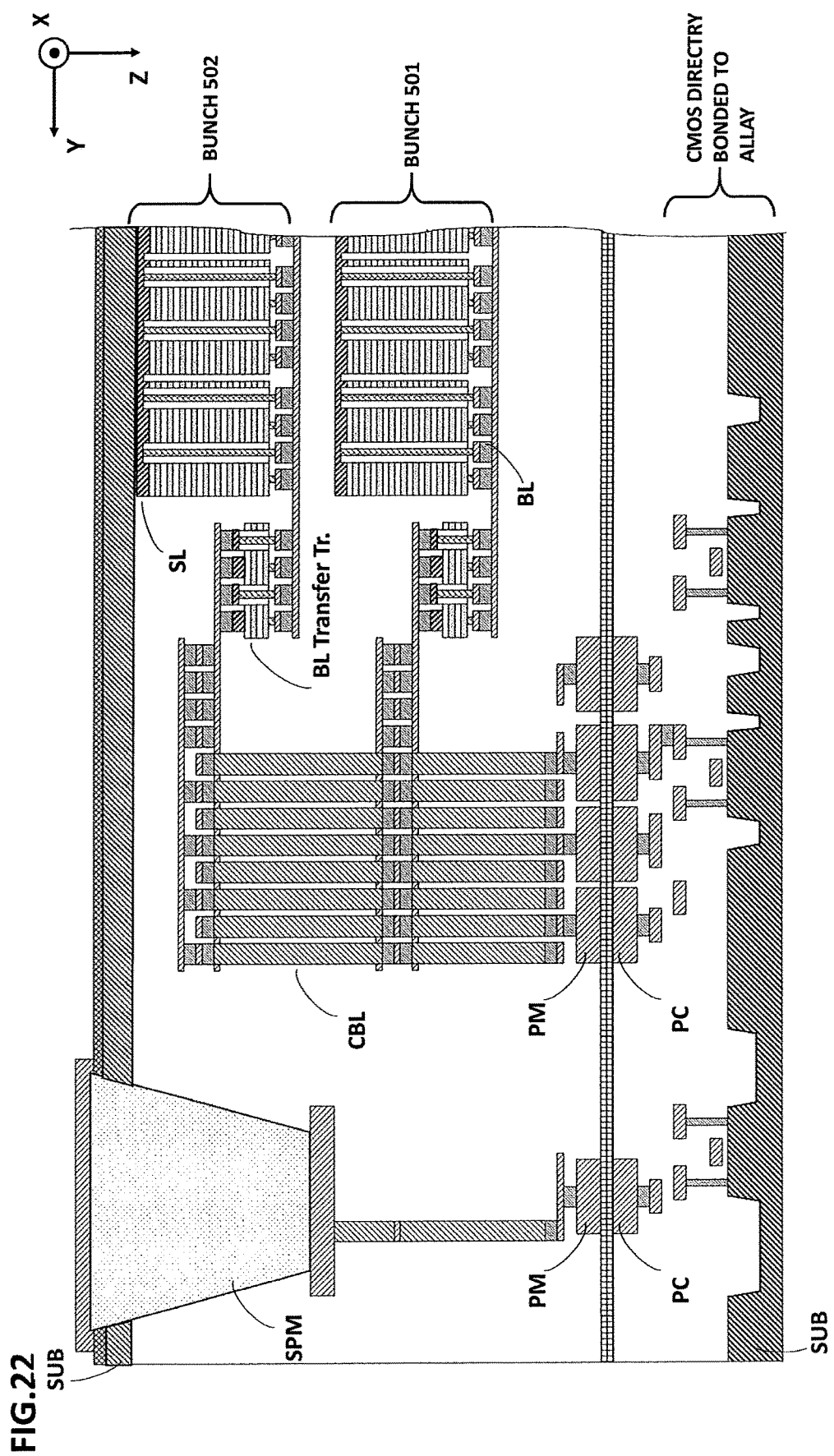
FIG. 22 is a cross-section showing a structure of a semiconductor memory device according to the present embodiment.

A configuration of a semiconductor memory device according to the present embodiment will be described with reference to FIG. 22. In the present embodiment, since it is the same as the first embodiment except that it includes a CMOS circuit chip, a repetition of the description will be omitted.

In this embodiment, the semiconductor memory device includes a peripheral circuit chip (CMOS). In the present embodiment, the peripheral chip and the memory cell array chip are formed separately on different semiconductor substrates. The upper surface of the memory cell array chip and the upper surface of the peripheral circuit chip (CMOS) are bonded together. An electrical pad PC is formed on the upper surface of the peripheral chip and an electrical pad PM is formed on the upper surface of the memory cell array chip. These electrical pad PCs and PMs are bonded so as to be connected. The semiconductor substrate side (back side) of the memory cell array chip is then polished to remove the semiconductor substrate to form the surface contact pad SPM.

Figure 23:
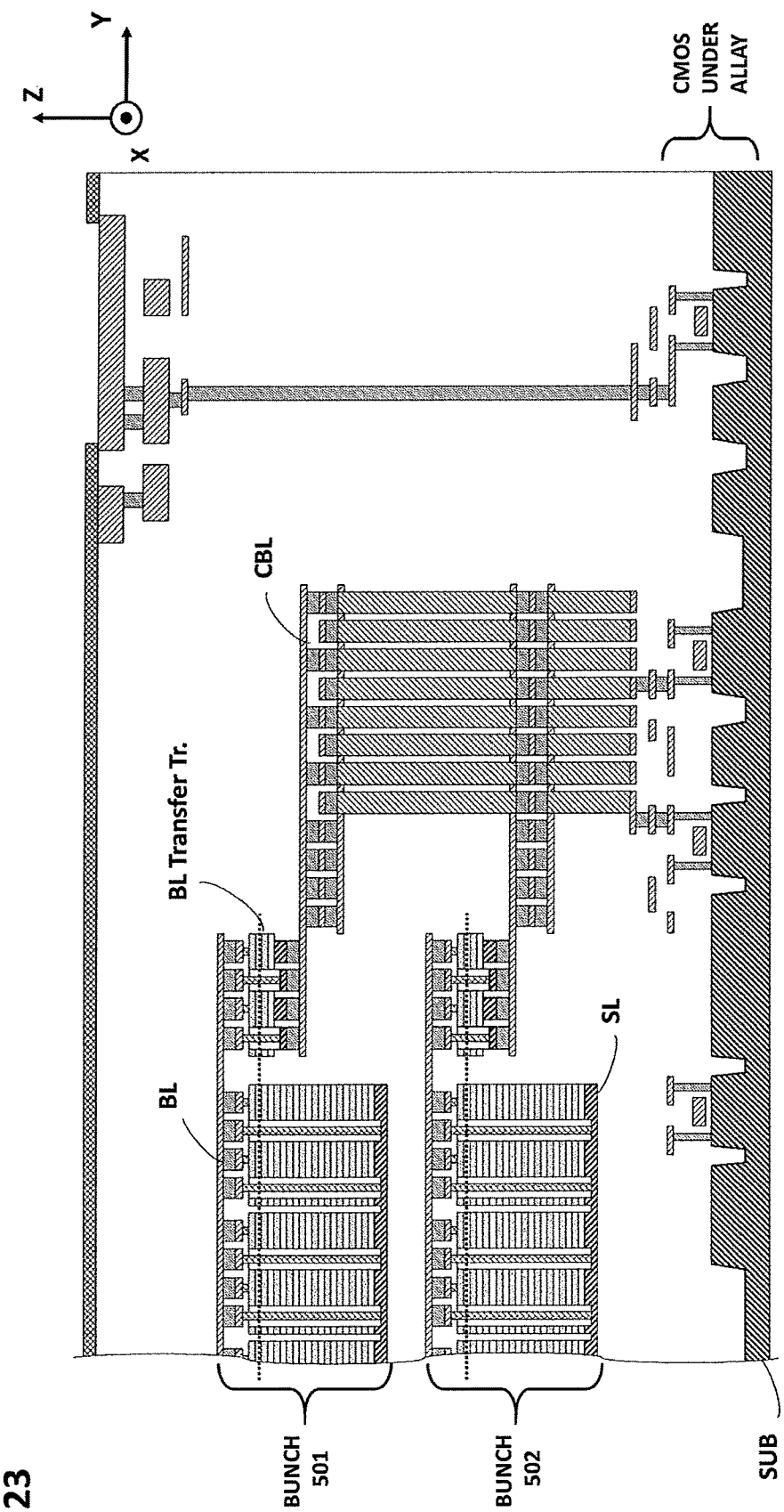
FIG. 23 is a cross-section showing a structure of a semiconductor memory device according to the present embodiment.

Thus, by forming the peripheral circuit chip and the memory cell array chip separately, the reliability of the semiconductor memory device can be improved without affecting the peripheral circuit chip by temperature. However, and not limited to this, the memory cell array may be integrated on top of the CMOS circuitry in the same chips, as illustrated in FIG. 23. In this case, the Bit line transfer gate line BL Transfer Gate and the drain-side selection gate line SGD may be provided in the same layer.

The Semiconductor Memory Device According to the Seventh Embodiment

In the first embodiment, the various control lines of the row system (the drain side selection gate line SGD, the word line WL, the source side selection gate line SGS, and the Source line SL) are individually drawn out and connected to the bunch and row decoder 19, which is a peripheral circuit, as shown in FIG. 10. In contrast, in the present embodiment, the drain side selection gate line SGD, the word line WL, the source side selection gate line SGS, and the Source line SL of the plurality of BUNCH are connected to the common drain side selection gate line CSGD, the common word line CWL, the common source side selection gate line CSGS, and the common Source line CSL, respectively.

Figure 24:
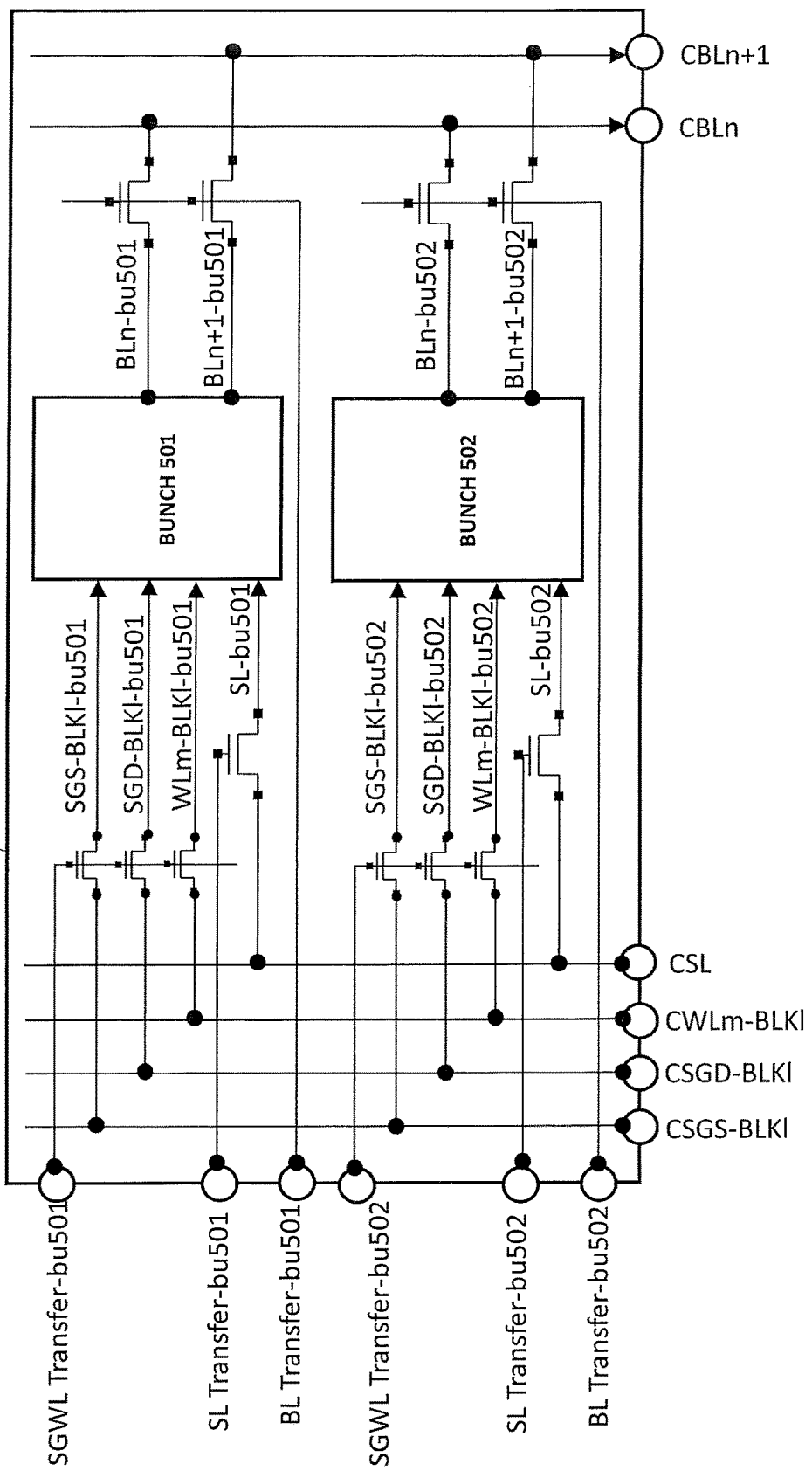
FIG. 24 is a circuit block diagram showing a configuration of a memory cell array according to the present embodiment.

As shown in FIG. 24, the memory cell array CELL ALLAY100 includes a BUNCH501, BUNCH502 . . . . As in the first embodiment, a Bit line BLn-bu501, BLn+1-bu501 . . . is derived from the BUNCH501, which is connected to the common Bit line CBLn, CBLn+1 . . . via a Bit line transfer transistor controlled by the Bit line transfer signal BL Transfer-bu501, BL Transfer-bu502 . . . respectively.

In the present embodiment, the following row-type control transistor are further formed inside the memory cell array. The forming position may be one of the positions shown in FIG. 5, FIG. 20, or FIG. 21.

The drain-side selection gate lines SGD-BLKI-bu501, SGD-BLKI-bu502 . . . of the plurality of bunches BUNCH501, BUNCH502 . . . are connected to the common-drain-side selection gate line CSGD-BLKI by transfer transistors controlled by the bunch select transfer signals SGWL Transfer-bu501, SGWL Transfer-bu502 . . . The source side selection gate line SGS-BLKI-bu501, SGS-BLKI-bu502 of the plurality of BUNCH501, BUNCH502 are connected to the common source side selection gate line CSGS-BLKI by a transfer transistor controlled by the bunch select transfer signal SGWL Transfer-bu501, SGWL Transfer-bu502 . . . . The plurality of word lines WLm-BLKI-bu501, WLm-BLKI-bu502 of the plurality of bunches BUNCH501, BUNCH502 are connected to the common source side selection gate line CWLm-BLKI by transfer transistors controlled by the bunch select transfer signals SGWL Transfer-bu501, SGWL Transfer-bu502 . . . .

The Source lines SL-bu501, SL-bu502 . . . of the plurality of bunches BUNCH501, BUNCH502 . . . are connected to the common Source line CSL by transfer transistors controlled by the source transfer signals SL Transfer-bu501, SL Transfer-bu502 . . . .

This arrangement can reduce the number of vertical wiring as shown in FIG. 10. In the present embodiment, the vertical wiring requires only the area of the common drain side selection gate line CSGD, the common word line CWL, the common source side selection gate line CSGS, and the common source line CSL, so that the chip area can be further reduced.

The Semiconductor Memory Device According to the Eighth Embodiment

In the present embodiment, a bunch control circuit (BUNCH CONTROLLER) for controlling various control lines of the row system (the drain side selection gate line SGD, the word line WL, the source side selection gate line SGS, and the Source line SL) is formed in the memory cell array CELL ALLAY100. The point that the common drain side selection gate line CSGD, the common word line CWL, the common source side selection gate line CSGS, and the common Source line CSL are arranged vertically is the same as that of the seventh embodiment.

Figure 25:
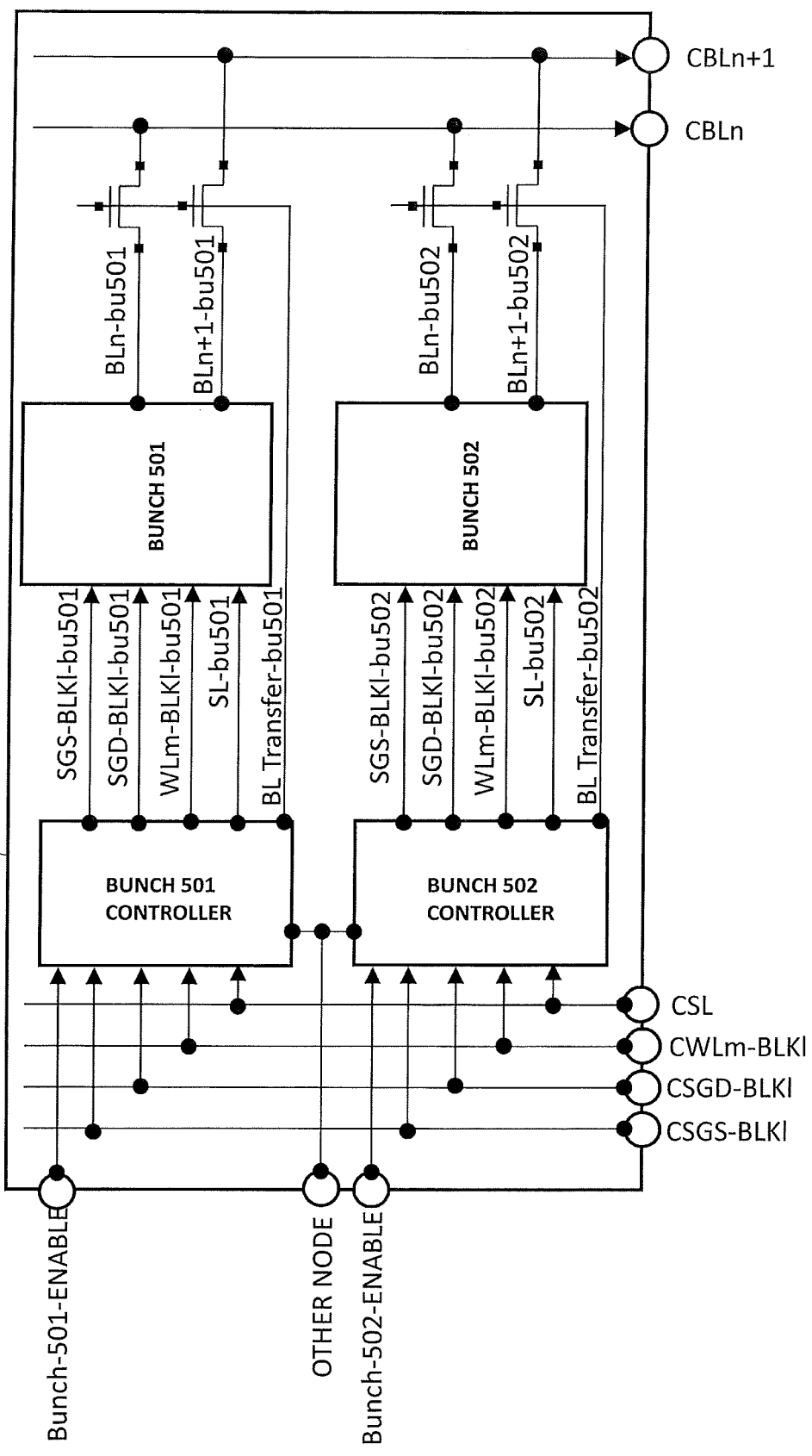
FIG. 25 is a circuit block diagram showing a configuration of a memory cell array according to the present embodiment.

As shown in FIG. 25, the bunch control circuit (BUNCH CONTROLLER) is provided corresponding to each BUNCH501, 502 . . . . The corresponding bunch enable signal line Bunch-501-ENABLE, Bunch-502-ENABLE and various other power lines (VDD+Vth, VSS, VRDEC, BSTON) are supplied to each bunch control circuit (BUNCH 501 CONTROLLER, BUNCH 502 CONTROLLER . . . ).

Bunch Control Circuit 1 with Level Shifter

Figure 26:
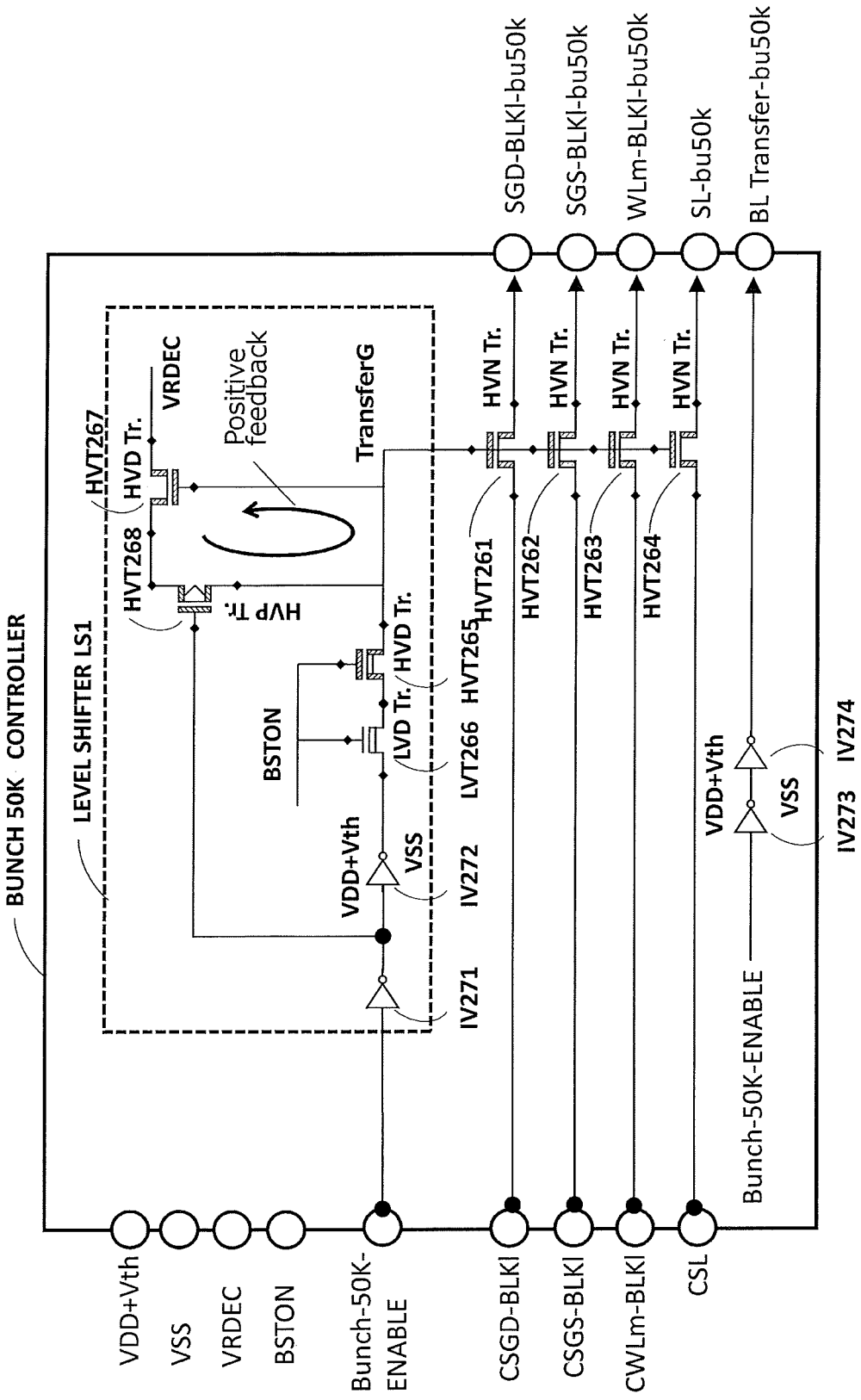
FIG. 26 is a circuit block diagram showing a configuration of a bunch control circuit according to the present embodiment.

FIG. 26 is a diagram showing a circuit configuration of the respective bunch control circuit BUNCH 50K CONTROLLER (BUNCH 501 CONTROLLER, BUNCH 502 CONTROLLER . . . ). The bunch control circuit BUNCH 50K CONTROLLER includes a level shifter circuit LS1, a high-voltage transistor HVT261, 262, 263, and 264, and an inverter circuit IV273 and 274.

The inverters IV273 and IV274 are connected in series and are driven by VDD+Vth and VSS. The bunch enable signal Bunch-50K-ENABLE is supplied to the input terminal of the inverter IV273, and the output terminal of the inverter IV273 is supplied to the input terminal of the inverter IV274. The inverter IV274 outputs a Bit line transfer signal BL Transfer-bu50k.

The high-voltage voltage transistor HVT261 is connected between the common-drain-side selection gate line CSGD-BLKI and the drain-side selection gate line SGD-BLKI-bu50k and is controlled by the transfer signals Transfer G. The high-voltage transistor HVT262 is connected between the common source side selection gate line CSGS-BLKI and the source select gate line SGS-BLKI-bu50k and is controlled by the transfer-signal Transfer G. The high-voltage transistor HVT263 is connected between the common word line CWLm-BLKI and the word line WLm-BLKI-bu50k and is controlled by the transfer signal Transfer G. The high-voltage transistor HVT264 is connected between the common Source line CSL and the Source line SL and is controlled by the transfer-signal Transfer G.

The level shifter circuit LS1 includes the inverter IV271, the inverter IV272, a low-voltage withstanding transistor LVT266, and a high-voltage transistor HVT265, which are connected in series between the terminal to which the bunch enable signal Bunch-50K-ENABLE is supplied and the terminal to which the transfer signal Transfer G is generated. The level shifter circuit LS1 further includes a high-voltage transistor HVT267 and a HVT268 connected in series between the terminal to which the VRDEC is supplied and the terminal to which the transfer signal Transfer G is generated. The inverters IV271 and IV272 are driven by VDD+Vth and VSS. BSTON signals control the gates of the low-voltage transistor LVT266 and the high-voltage transistor HVT265. The gate of the high-voltage transistor HVT267 is connected to the terminal where the transfer signal Transfer G is generated, and the gate of the high-voltage transistor HVT268 is connected to the output terminal of the inverter IV271.

Figure 27:
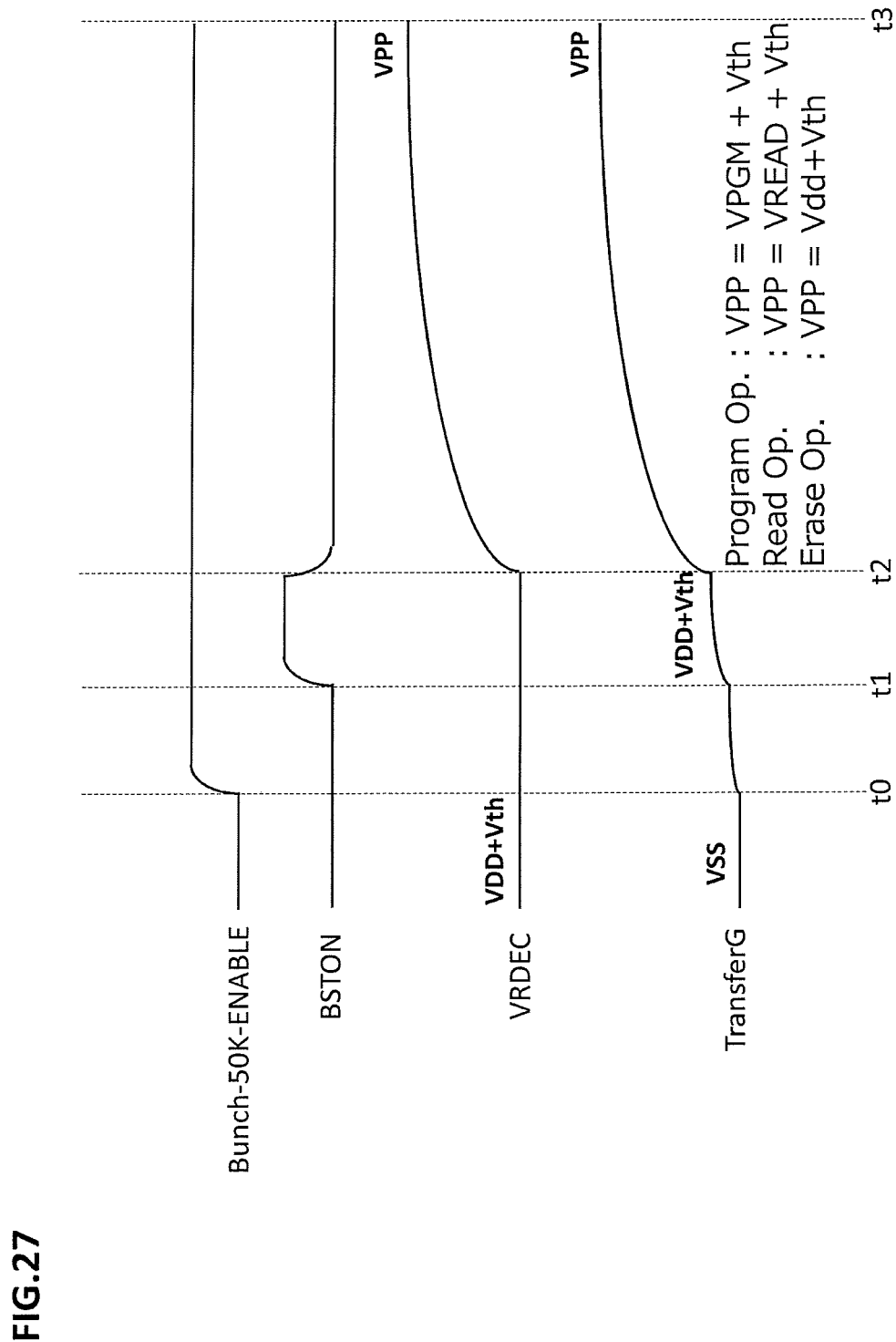
FIG. 27 is a diagram showing an operation of a bunch control circuit according to the present embodiment.

FIG. 27 shows the operation of the bunch control circuit BUNCH 50K CONTROLLER. The bunch enable signal Bunch-50K-ENABLE goes to high level at time t0. This results in the output of inverter IV272 also becomes VDD+Vth. Then, at time t1, the BSTON goes to high level. This results in a gradual increase in Transfer G to VDD+Vth. The VRDEC then rises from VDD+Vth to VPP at time t2. Since the high-voltage HVT268 is P-type and the gates are supplied with VSSs, the positive feedback loops shown in the diagram are formed, and the VPP supplied to the VRDEC raises the Transfer G to VPP. The high-voltage generated in this way is supplied to the gates of the high-voltage transistors HVT261 to 264, and the voltages of the common drain side selection gate line CSGD, the common word line CWL, the common source side selection gate line CSGS, and the common Source line CSL are supplied to the drain side selection gate line SGD, the word line WL, the source side selection gate line SGS, and the Source line CSL without dropping the threshold. The VPP voltage is supplied to the Transfer G terminal, and the VPP voltage varies depending on the operation.

Bunch Control Circuit 2 with Level Shifter

Figure 28:
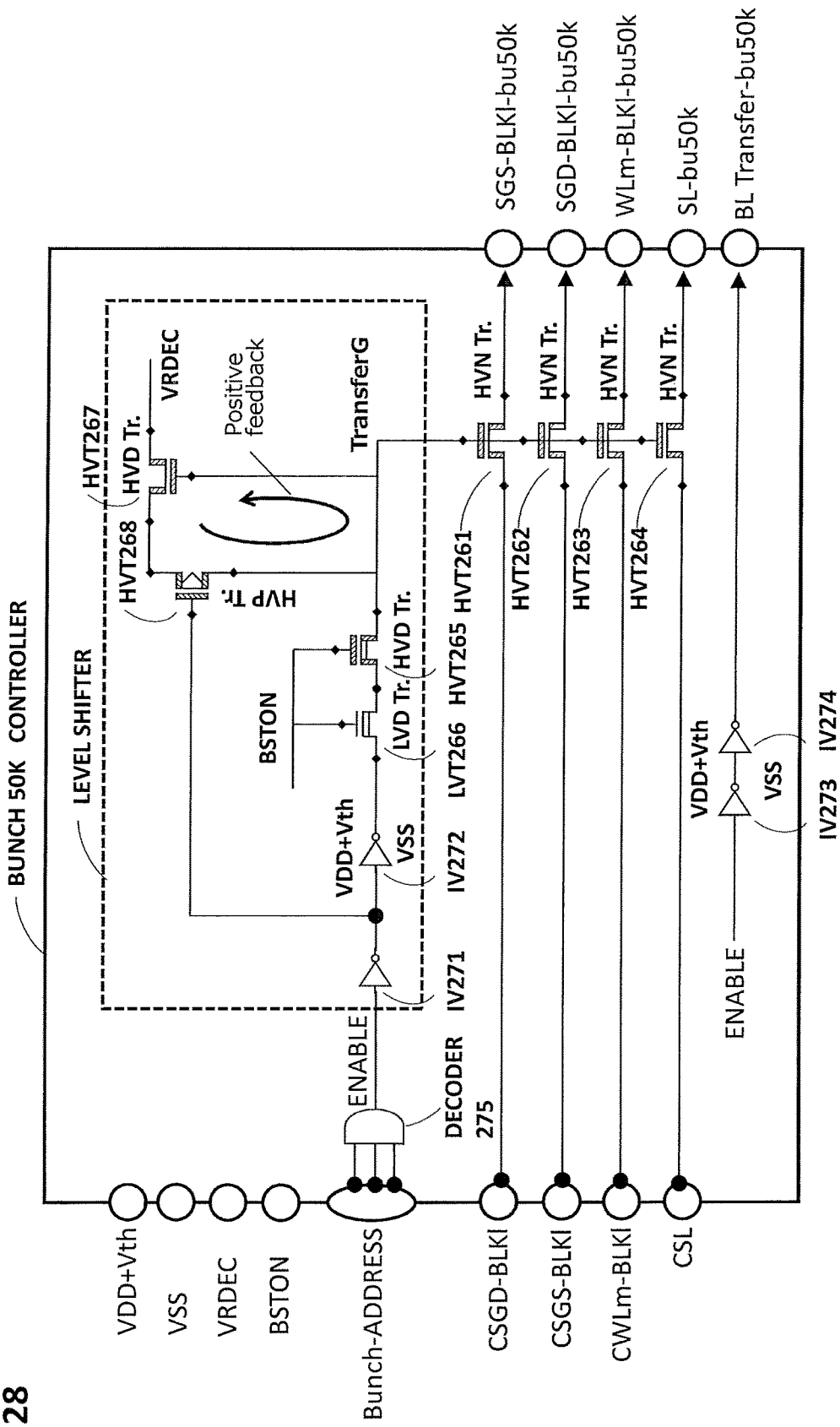
FIG. 28 is a circuit block diagram showing a configuration of a row control circuit according to the present embodiment.

FIG. 28 shows a modification of the circuit configuration of the bunch control circuit BUNCH 50K CONTROLLER (BUNCH 501 CONTROLLER, BUNCH 502 CONTROLLER . . . ). The difference from the circuit of FIG. 26 is that a decode circuit 275 is incorporated that generates a bunch enable signal Bunch-50K-ENABLE. The decode circuit 275 may comprise, for example, an AND gate. The other circuit configuration is the same as that of FIG. 26, so a description thereof will be omitted.

Bunch Control Circuit 3 with Level Shifter

Figure 29:
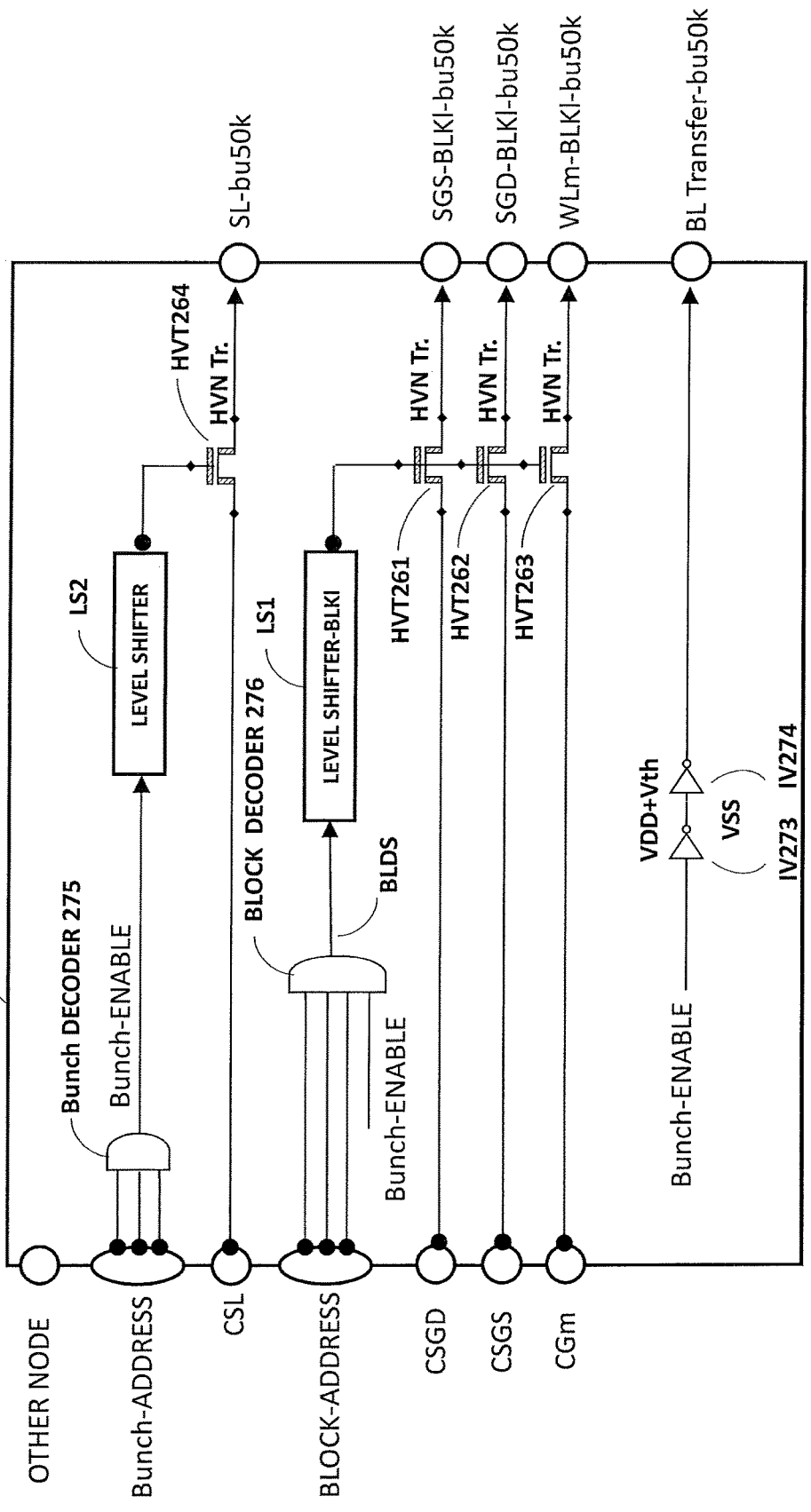
FIG. 29 is a circuit block diagram showing a configuration of a row control circuit according to the present embodiment.

FIG. 29 shows a further modification of the circuit configuration of each bunch control circuits BUNCH 50K CONTROLLER (BUNCH 501 CONTROLLER, BUNCH 502 CONTROLLER . . . ). The difference from the circuit of FIG. 28 is that a decode circuit 276 is incorporated that decodes the block address BLOCK-ADDRESS to produce a block decode signal BLDS. The decode circuit 276 may comprise, for example, an AND gate. The level shifter circuit has two identical circuit configurations, one is the level shifter circuit LS1 described above, and one is the level shifter circuit LS2. The level shifter LS2 level shifts the bunch enable signal Bunch-ENABLE to control the gating of the high-voltage transistor HVT264. The level shifter LS1 controls the gates of the remaining high-voltage withstanding transistors HVT261, 262, and 263. The other circuit configuration is the same as that of FIG. 28, so description thereof will be omitted.

Figure 30:
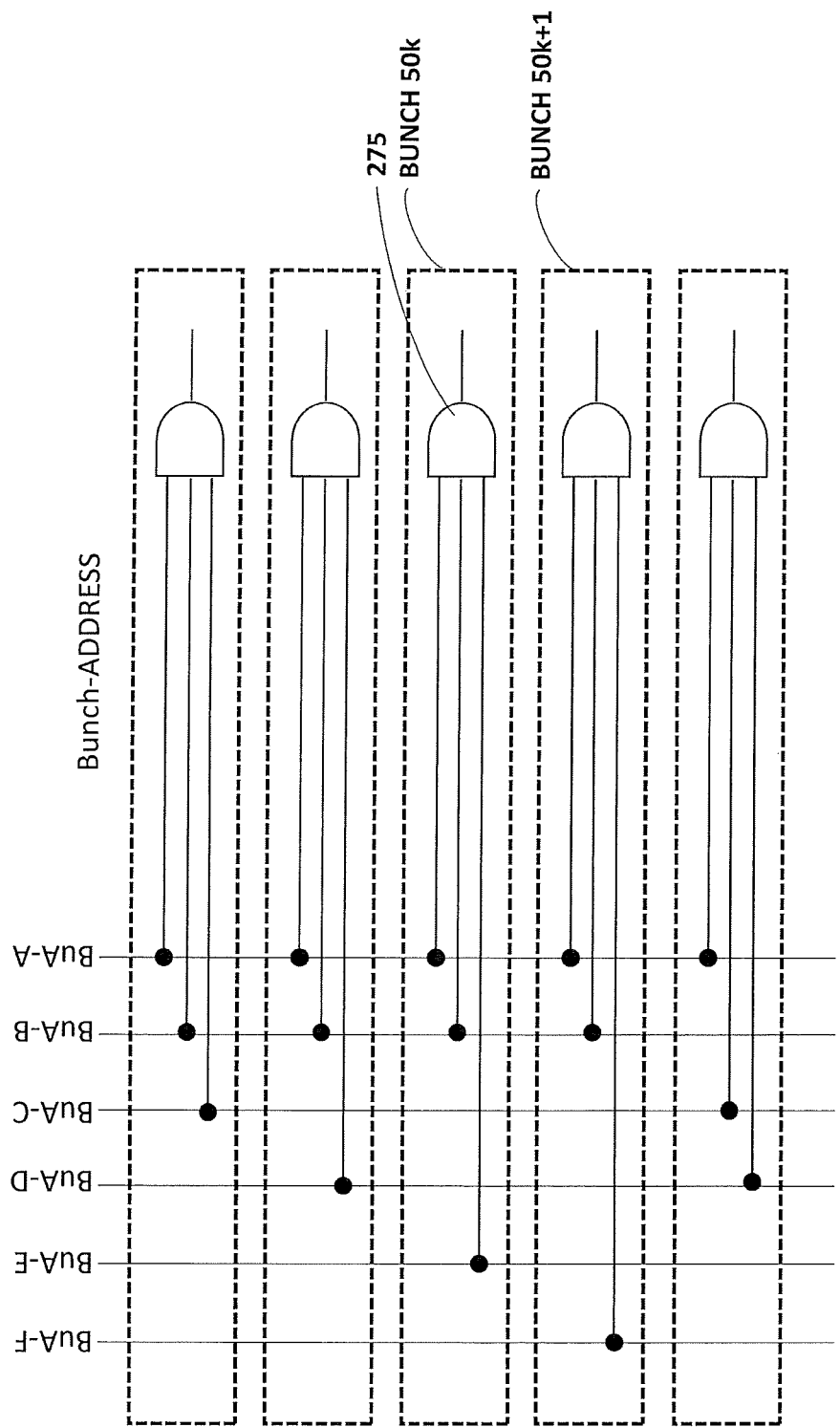
FIG. 30 is a diagram showing a decode operation of a decode circuit according to the present embodiment.

FIG. 30 shows how the decode circuit 275 used in the bunch control circuit 2 or 3 performs the decode operation. The bunch address is pre-decoded into a plurality of pre-decoded signals (BuA-A, BuA-B, BuA-C, BuA-D, BuA-E, BuA-F). Part of these pre-decoded signals are supplied to the input terminals of a decode circuit 275 including an AND gate. The pre-decoded signals (BuA-A, BuA-B, BuA-C, BuA-D, BuA-E, BuA-F) run vertically within the memory cell array. In this way, the number of control signal lines of the row system running vertically can be reduced, and the chip area can be reduced.

Figure 31:
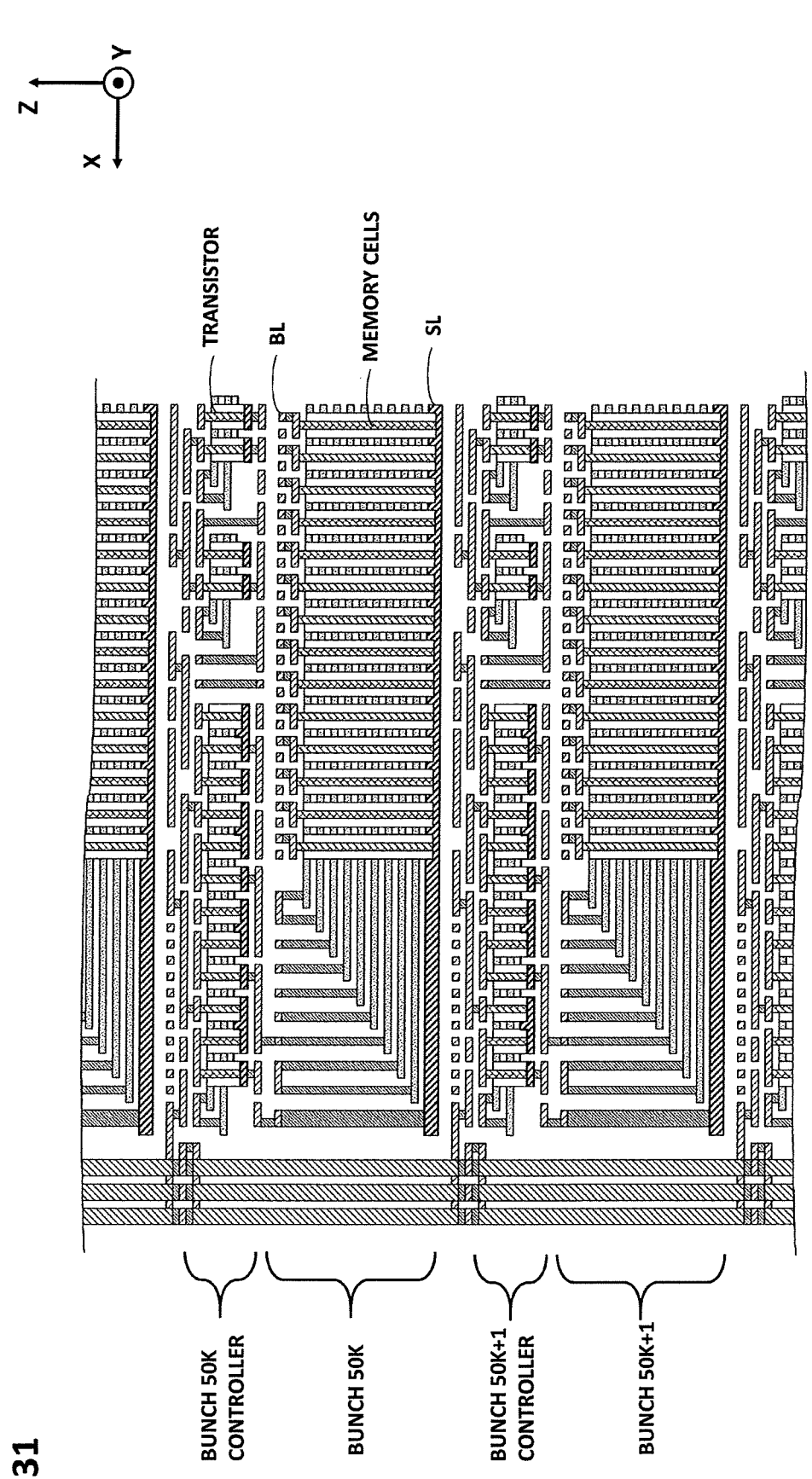
FIG. 31 is a cross-section showing a structure of a semiconductor memory device according to the present embodiment.

FIG. 31 is a cross-section (XZ plane) of a stacked BUNCH50K, BUNCH50K+1. The bunch control circuits BUNCH 50K CONTROLLER (BUNCH 50K CONTROLLER, BUNCH 50K+1 CONTROLLER . . . ) corresponding to the bunches are arranged so as to be sandwiched between the bunches BUNCH arranged vertically. In this way, the area of the peripheral circuit can be greatly reduced, and the control signal line of the row system running vertically can be drastically reduced (as opposed to FIG. 10). As a result, it is possible to reduce the chip area and increase the memory storage capacity per unit area.

In FIG. 31, the Bit line transfer transistor BL Transfer Tr. is shown as a vertical semiconductor. However, and not limited to this, the Bit line transfer transistor BL Transfer Tr. may be a fin-type semiconductor in which gate is positioned to encompass the channels and form a double gate configuration. The fin-type semiconductor may be, for example, fully depleted silicon-on-insulators (FD-SOI) on a buried silicon oxide film.

What is claimed is:

1. A semiconductor memory device comprising:
a first memory bunch comprising:
a first source line extending in a first direction and a second direction perpendicular to the first direction;
a first source side selecting gate transistor arranged on one side in a third direction intersecting the first direction and the second direction of the first source line;
a first source side selecting gate line connected to a gate of the first source side selecting gate transistor, the first source side selecting gate line extending in the first direction and the second direction;
a plurality of first non-volatile memory cells series connected to the first source side selecting gate transistor, the plurality of first non-volatile memory cells arranged on the one side in the third direction of the first source side selecting gate transistor;
a plurality of first word lines stacked in the third direction and each connected to a gate of a corresponding one of the plurality of first non-volatile memory cells, the plurality of first word lines extending in the first direction and the second direction;
a first drain side selecting gate transistor connected to one of the plurality of first non-volatile memory cells, the first drain side selecting gate transistor arranged on the one side in the third direction of the plurality of first non-volatile memory cells;
a first drain side selecting gate line connected to a gate of the first drain side selecting gate transistor, the first drain side selecting gate line extending in the first direction and the second direction; and
a first bit line connected to the first drain side selecting gate transistor, the first bit line arranged on the one side in the third direction of the first drain side selecting gate line, a longitudinal direction of the first bit line being in the second direction;
a second memory bunch comprising:
a second source line extending in the first direction and the second direction, the second source line arranged on the one side in the third direction of the first bit line;
a second source side selecting gate transistor arranged on the one side in the third direction of the second source line;
a second source side selecting gate line connected to a gate of the second source side selecting gate transistor, the second source side selecting gate line extending in the first direction and the second direction;
a plurality of second non-volatile memory cells series connected to the second source side selecting gate transistor, the plurality of second non-volatile memory cells arranged on the one side in the third direction of the second source side selecting gate transistor;
a plurality of second word lines stacked in the third direction and each connected to a gate of a corresponding one of the plurality of second non-volatile memory cells, the plurality of second word lines extending in the first direction and the second direction and the plurality of second word lines overlapping with the plurality of first word lines in the third direction;
a second drain side selecting gate transistor connected to one of the plurality of second non-volatile memory cells, the second drain side selecting gate transistor arranged on the one side in the third direction of the plurality of second non-volatile memory cells;
a second drain side selecting gate line connected to a gate of the second drain side selecting gate transistor, the second drain side selecting gate line extending in the first direction and the second direction; and
a second bit line connected to the second drain side selecting gate transistor, the second bit line arranged on the one side in the third direction of the second drain side selecting gate line, a longitudinal direction of the second bit line being in the second direction;
a common bit line;
a first bit line transfer transistor connected between the common bit line and the first bit line; and
a second bit line transfer transistor connected between the common bit line and the second bit line.

2. The semiconductor memory device according to claim 1, further comprising;
a third memory bunch comprising:
a third source line extending in the first direction and the second direction, the third source line arranged on the one side in the third direction of the second bit line;
a third source side selecting gate transistor arranged on the one side in the third direction of the third source line;
a third source side selecting gate line connected to a gate of the third source side selecting gate transistor, the third source side selecting gate line extending in the first direction and the second direction;
a plurality of third non-volatile memory cells series connected to the third source side selecting gate transistor, the plurality of third non-volatile memory cells arranged on the one side in the third direction of the third source side selecting gate transistor;
a plurality of third word lines each connected to a gate of a corresponding one of the plurality of third non-volatile memory cells, the plurality of third word lines extending in the first direction and the second direction;
a third drain side selecting gate transistor connected to one of the plurality of third non-volatile memory cells, the third drain side selecting gate transistor arranged on the one side in the third direction of the plurality of third non-volatile memory cells;
a third drain side selecting gate line connected to a gate of the third drain side selecting gate transistor, the third drain side selecting gate line extending in the first direction and the second direction; and
a third bit line connected to the third drain side selecting gate transistor, the third bit line arranged on the one side in the third direction of the third drain side selecting gate line, a longitudinal direction of the third bit line being in the second direction; and
a third bit line transfer transistor connected between the common bit line and the third bit line,
wherein a longitudinal direction of the common bit line is along the third direction from at least a position corresponding to the third source side selecting gate transistor to a position corresponding to the second drain side selecting gate transistor in the third direction.

3. The semiconductor memory device according claim 2, further comprising:
a first transfer wiring connecting the common bit line and the first bit line transfer transistor;
a second transfer wiring connecting the common bit line and the second bit line transfer transistor; and
a third transfer wiring connecting the common bit line and the third bit line transfer transistor,
wherein at least a part of a longitudinal direction of each of the first transfer wiring, the second transfer wiring, and the third transfer wiring are arranged in the second direction.

4. The semiconductor memory device according to claim 1, further comprising:
a first bit line transfer gate line connected to a gate of the first bit line transfer transistor, the first bit line transfer gate line extending in the first direction and the second direction, wherein
the first bit line transfer transistor is arranged on one side in the second direction of the second source side selecting gate transistor, and
a virtual plane extending in the first direction and the second direction passes through the second source side selecting gate line and the first bit line transfer gate line.

5. The semiconductor memory device according to claim 1, further comprising:
a first bit line transfer gate line connected to a gate of the first bit line transfer transistor, wherein
the first bit line transfer transistor is arranged on one side in the second direction of the first drain side selecting gate transistor, and
a virtual plane extending in the first direction and the second direction passes through the first drain side selecting gate line and the first bit line transfer gate line.

6. The semiconductor memory device according to claim 1, wherein
the first bit line transfer transistor is arranged between the first bit line and the second source line in the third direction, and
at least a part of the first bit line and at least a part of the first bit line transfer transistor overlap when viewed from the third direction.

7. The semiconductor memory device according to claim 1, further comprising:
a semiconductor substrate arranged on other side in the third direction of the first source line; and
a CMOS control circuit formed on the semiconductor substrate configured to supply a first control voltage to a gate of the first bit line transfer transistor and supply a second control voltage to a gate of the second bit line transfer transistor.

8. The semiconductor memory device according to claim 1, further comprising:
a semiconductor substrate arranged on the one side in the third direction of the second bit line; and
a CMOS control circuit formed on the semiconductor substrate configured to supply a first control voltage to a gate of the first bit line transfer transistor and supply a second control voltage to a gate of the second bit line transfer transistor.

9. The semiconductor memory device according to the claim 1, further comprising:
a first row control circuit arranged between the first bit line and the second source line in the third direction, the first row control circuit configured to supply a voltage to the plurality of first word lines, the first source side selecting gate line, and the first drain side selecting gate line.

10. The semiconductor memory device according to the claim 9, wherein
the first row control circuit comprises:
a plurality of first word line transfer transistors connected to the plurality of first word lines;
a first source side selecting gate line transfer transistor connected to the first source side selecting gate line; and
a first drain side selecting gate line transfer transistor connected to the first drain side selecting gate line; and
a common selection signal is configured to supply to the gates of the plurality of first word line transfer transistors, the gate of the first source side selection gate line transfer transistor, and the gate of the first drain side selection gate line transfer transistor.

11. The semiconductor memory device according to the claim 10, wherein the first row control circuit comprises:
a first decode circuit connected to a plurality of bunch selection signal lines, a longitudinal direction of the plurality of the bunch selection signal lines is respectively along the third direction, the first decode circuit configured to output an enable signal; and a first level shift circuit configured to supply the selection signal based on the enable signal output from the first decode circuit.

12. The semiconductor memory device according to claim 1, wherein each of the plurality of first word lines has an substantially plate shape, and each of the plurality of second word lines has an substantially plate shape.

13. The semiconductor memory device according to claim 12, wherein a memory hole penetrates the plurality of first word lines in the third direction, and in the memory hole, a semiconductor film is formed along the third direction and an insulating film is formed around the semiconductor film.

14. The semiconductor memory device according to claim 13, wherein the insulating film includes:

a tunnel insulating film formed at an outer periphery of the semiconductor film, a charge trapping film formed at an outer periphery of the tunnel insulating film, and a block insulating film formed at an outer periphery of the charge trapping film.

15. A semiconductor memory device comprising:

a first memory bunch comprising:

a first source line extending in a first direction and a second direction perpendicular to the first direction;

a first source side selecting gate transistor arranged on one side in a third direction intersecting the first direction and the second direction of the first source line;

a first source side selecting gate line connected to a gate of the first source side selecting gate transistor, the first source side selecting gate line extending in the first direction and the second direction;

a plurality of first non-volatile memory cells series connected to the first source side selecting gate transistor, the plurality of first non-volatile memory cells arranged on the one side in the third direction of the first source side selecting gate transistor;

a plurality of first word lines stacked in the third direction and each connected to a gate of a corresponding one of the plurality of first non-volatile memory cells, the plurality of first word lines extending in the first direction and the second direction;

a first drain side selecting gate transistor connected to one of the plurality of first non-volatile memory cells, the first drain side selecting gate transistor arranged on the one side in the third direction of the plurality of first non-volatile memory cells;

a first drain side selecting gate line connected to a gate of the first drain side selecting gate transistor, the first drain side selecting gate line extending in the first direction and the second direction; and a first bit line connected to the first drain side selecting gate transistor, the first bit line arranged on the one side in the third direction of the first drain side selecting gate line, a longitudinal direction of the first bit line being in the second direction;

a second memory bunch comprising:

a second source line extending in the first direction and the second direction, the second source line arranged on the one side in the third direction of the first bit line;

a second source side selecting gate transistor arranged on the one side in the third direction of the second source line;

a second source side selecting gate line connected to a gate of the second source side selecting gate transistor, the second source side selecting gate line extending in the first direction and the second direction;

a plurality of second non-volatile memory cells series connected to the second source side selecting gate transistor, the plurality of second non-volatile memory cells arranged on the one side in the third direction of the second source side selecting gate transistor;

a plurality of second word lines stacked in the third direction and each connected to a gate of a corresponding one of the plurality of second non-volatile memory cells, the plurality of second word lines extending in the first direction and the second direction and the plurality of second word lines overlapping with the plurality of first word lines in the third direction;

a second drain side selecting gate transistor connected to one of the plurality of second non-volatile memory cells, the second drain side selecting gate transistor arranged on the one side in the third direction of the plurality of second non-volatile memory cells;

a second drain side selecting gate line connected to a gate of the second drain side selecting gate transistor, the second drain side selecting gate line extending in the first direction and the second direction; and a second bit line connected to the second drain side selecting gate transistor, the second bit line arranged on the one side in the third direction of the second drain side selecting gate line, a longitudinal direction of the second bit line being in the second direction;

a first vertical bit line connected to the first bit line, a longitudinal direction of the first vertical bit line being in the third direction; and a second vertical bit line connected to the second bit line, a longitudinal direction of the second vertical bit line being in the third direction, wherein a longitudinal direction of the first vertical bit line is along the third direction from at least a position corresponding to the second drain side selecting gate transistor to a position corresponding to the second source side selecting gate transistor in the third direction.

16. The semiconductor memory device according to claim 15, wherein each of the plurality of first word lines has an substantially plate shape, and each of the plurality of second word lines has an substantially plate shape.

17. The semiconductor memory device according to claim 16, wherein a memory hole penetrates the plurality of first word lines in the third direction, and in the memory hole, a semiconductor film is formed along the third direction and an insulating film is formed around the semiconductor film.

18. The semiconductor memory device according to claim 17, wherein the insulating film includes:
   a tunnel insulating film formed at an outer periphery of the semiconductor film,
   a charge trapping film formed at an outer periphery of the tunnel insulating film, and
   a block insulating film formed at an outer periphery of the charge trapping film.

* * * * *